US012628459B1

(12) United States Patent
Zaniewski et al.

(10) Patent No.: US 12,628,459 B1
(45) Date of Patent: May 12, 2026

(54) DUAL FUNCTION DIAMOND-BASED SEMICONDUCTOR DEVICE

(71) Applicant: Advent Diamond, Inc., Scottsdale, AZ (US)

(72) Inventors: Anna Zaniewski, Scottsdale, AZ (US); Jesse Brown, Scottsdale, AZ (US); Jose Andres Orozco, Scottsdale, AZ (US); Manpuneet Kaur Benipal, Scottsdale, AZ (US)

(73) Assignee: Advent Diamond, Inc., Scottsdale, AZ (US)

( * ) Notice: Subject to any disclaimer, the term of this patent is extended or adjusted under 35 U.S.C. 154(b) by 484 days.

(21) Appl. No.: 18/227,917

(22) Filed: Jul. 29, 2023

(51) Int. Cl.
　　*H10F 77/1223*　　(2025.01)
　　*H10F 30/29*　　(2025.01)

(52) U.S. Cl.
　　CPC ......... *H10F 77/1223* (2025.01); *H10F 30/29* (2025.01)

(58) Field of Classification Search
　　CPC .............................. H10F 30/29; H10F 77/1223
　　See application file for complete search history.

(56) References Cited

U.S. PATENT DOCUMENTS

| | | | | |
|---|---|---|---|---|
| 5,298,766 | A * | 3/1994 | Kobashi | H10D 62/8303 |
| | | | | 257/77 |
| 6,204,522 | B1 * | 3/2001 | Bernhoff | H10F 30/222 |
| | | | | 257/E29.081 |
| 8,592,824 | B2 * | 11/2013 | Yamasaki | H01L 21/02527 |
| | | | | 257/77 |
| 2020/0119207 | A1 | 4/2020 | Holmes et al. | |

FOREIGN PATENT DOCUMENTS

| | | | | | |
|---|---|---|---|---|---|
| DE | 102017206279 | A1 * | 10/2018 | | G01R 33/032 |
| FR | 2949905 | A1 * | 3/2011 | | H10F 30/10 |

* cited by examiner

*Primary Examiner* — Evren Seven
(74) *Attorney, Agent, or Firm* — Rahman LLC

(57) ABSTRACT

A diamond-based particle detector includes a diamond substrate that includes a first side and a second side; a first side first doped layer contacting the first side of the diamond substrate; a first metal contact contacting the first side first doped layer, a first side intrinsic diamond layer contacting the first side first doped layer, (i) a second side first doped layer or (ii) a second side intrinsic diamond layer contacting the second side of the diamond substrate; and a second metal contact contacting (i) the second side first doped layer or (ii) the second side intrinsic diamond layer.

20 Claims, 25 Drawing Sheets

DUAL FUNCTION DIAMOND-BASED SEMICONDUCTOR DEVICE

GOVERNMENT INTEREST

This invention was made with government support under DTRA award HDTRA2-22-C-0002, DOE award #DE-SC0019659, NASA award #80NSSC22PA926, and NSF award #1951263. The government has certain rights in the invention.

BACKGROUND

Technical Field

The embodiments herein generally relate to radiation detectors, and more particularly to a diamond-based solid state particle/radiation detector.

Description of the Related Art

Alpha particle detectors currently used in field applications are based upon a scintillator (fluorescent material) and photomultiplier tube. Generally, alpha particles pass through a mylar window to a scintillator screen, which generates light when radiated. The light from the scintillator is sent through a prism to a photomultiplier tube, which converts and amplifies the light to an electrical signal. A large active area is needed to locate alpha emitters, since the range of alpha particles in air is very short, making alpha emitters hard to locate.

Beta particle detectors, such as the beta/gamma probe for the AN/PDR-77 military radiac set are based on cylindrical gas chambers. This detector works in the following way: radiation in the cylindrical chamber causes an ionization of the gas. An electric field between the anode (inside the chamber) and the cathode (chamber walls) cause the charged particles to drift, creating a current, which is the measured signal. When the beta shield is opened, a thin mylar window enables the penetration of beta radiation into the chamber.

Unstructured diamond detectors (e.g., MIM: metal-intrinsic layer-metal) are available for x-ray monitoring (e.g., an x-ray beam positioning detector). These are relatively simple devices, consisting of intrinsic diamond with metal read out contacts. Detectors of this type require controlled irradiation to saturate the polarization and stabilize the signal. In addition, they need hundreds of volts to generate signal.

Components of the state of the art systems include a mylar window, glass prism optics, and photomultiplier tubes (PMT). Physical shocks could damage the glass prism, mirrors, and/or PMTs; however, the component most subject to failure in the field is the window (typically mylar or coated mica). Indeed, even decontaminating the window from debris can cause damage, limiting its lifetime and reliability.

Thus, both the Beta/Gamma and Alpha detectors currently used in industry rely on thin fragile windows which are susceptible to puncture and failure in the field and are difficult to decontaminate. A third type of detector, the alpha/beta "pancake"-type detector also uses a similar window to block visible light.

The high voltage required for the metal-insulator-metal (MIM) diamond based detectors makes them bulky and causes increased electrical noise. The polarizability of MIM diamond detectors reduces efficiency and the controlled irradiation source required to saturate the polarization is impractical for use in the field. For these reasons, unstructured diamond is less suited to field use. Dual-sided detectors also allow additional measurements to be made at lower cost than single-sided detectors by reusing the diamond substrate.

Other semiconductor particle detectors include silicon detectors. However, because silicon is sensitive to light and thermal noise, these require light-blocking windows, active cooling, and long background measurement times, and are typically not used outside for these reasons.

Radiation detectors are needed for a large swath of technological sectors. Miniaturized, compact, and rugged radiation detector design is desirable across many applications. Some of the issues with conventional detector options include difficulty detecting low activity sources, which stems from low efficiency, and sensitivity to visible light, which increases background noise and leads to false positives. Additionally, the differentiation of particle species uses a set of different detector structures which requires separate active areas, increasing system complexity, size, and cost. In addition, many particle detectors available in the industry are not selective to the radiation type and will be responsive to a variety of energetic inputs. Accordingly, there remains a need for an improved solid state particle/radiation detector.

SUMMARY

In view of the foregoing, an embodiment herein provides a dual function diamond-based semiconductor device comprising a vertically stacked structure comprising a first side and a second side, wherein the first side is oppositely positioned to the second side; a diode arranged on the first side, wherein the diode comprises: a diamond substrate; a first side first doped layer adjacent to the diamond substrate; and a first side intrinsic diamond layer adjacent to the first side first doped layer. The semiconductor device further comprises a photoresistor arranged on the second side, wherein the photoresistor comprises: the diamond substrate shared with the diode; and a second side first doped layer adjacent to the diamond substrate.

The first side first doped layer may be positioned between the diamond substrate and the first side intrinsic diamond layer. The first side first doped layer may comprise a p or n type diamond material. The diode may further comprise a metal contact adjacent to the first side first doped layer. The diode may further comprise a metal contact adjacent to the first side intrinsic diamond layer. The diode may further comprise a first side second doped layer adjacent to the intrinsic diamond layer or adjacent to the first side first doped layer (e.g., pn diode). The first side intrinsic diamond layer may be positioned between the first side first doped layer and the first side second doped layer. The diode may further comprise a metal contact adjacent to the first side second doped layer. The diode may further comprise a neutron conversion layer adjacent to the metal contact. The metal contact may be positioned between the neutron conversion layer and the first side second doped layer or the first side intrinsic diamond layer.

Each of the first side first doped layer, the second side first doped layer, the first side intrinsic diamond layer, and the first side second doped layer may comprise a single crystal material, polycrystalline material, or a nanocrystalline material. The second side first doped layer may comprise a p-type diamond material, a n-type diamond layer, a second side intrinsic diamond layer, and/or an additional low resistance layer comprising a p or n diamond or conducting nanocarbon layer adjacent to the diamond substrate.

The photoresistor may further comprise a metal contact adjacent to the second side first doped layer, a second side intrinsic diamond layer, or to the diamond substrate. The photoresistor may further comprise a neutron conversion layer adjacent to the metal contact and (i) the second side first doped layer, (ii) the second side intrinsic diamond layer, or (iii) the diamond substrate. The second side first doped layer or (ii) the second side intrinsic diamond layer may be positioned between the diamond substrate and the neutron conversion layer. The metal contact may be positioned between the neutron conversion layer and (i) the second side first doped layer, (ii) the second side intrinsic diamond layer, or (iii) the diamond substrate.

Another embodiment provides a dual function diamond-based semiconductor device comprising a vertically stacked structure comprising a first side and a second side, wherein the first side is oppositely positioned to the second side; a diode arranged on the first side, wherein the diode comprises: a diamond substrate; a first side first doped layer adjacent to the diamond substrate; and a first side intrinsic diamond layer adjacent to the first side first doped layer. The semiconductor device further comprises a photoresistor arranged on the second side, wherein the photoresistor comprises the diamond substrate shared with the diode.

Another embodiment provides a diamond-based particle detector comprising a diamond substrate comprising a first side and a second side; a first side first doped layer contacting the first side of the diamond substrate; a first metal contact contacting the first side first doped layer; a first side intrinsic diamond layer contacting the first side first doped layer, wherein the first side first doped layer is positioned between the diamond substrate and the first side intrinsic diamond layer; (i) a second side first doped layer or (ii) a second side intrinsic diamond layer contacting the second side of the diamond substrate; and a second metal contact contacting (i) the second side first doped layer or (ii) the second side intrinsic diamond layer.

The diamond-based particle detector may further comprise a first side second doped layer contacting the first side intrinsic diamond layer. The diamond-based particle detector may further comprise a third metal contact contacting the first side second doped layer. The diamond-based particle detector may further comprise a neutron conversion layer contacting the third metal contact. The diamond-based particle detector may further comprise a neutron conversion layer contacting the second metal contact and (i) the second side first doped layer or (ii) the second side intrinsic diamond layer.

These and other aspects of the embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1:
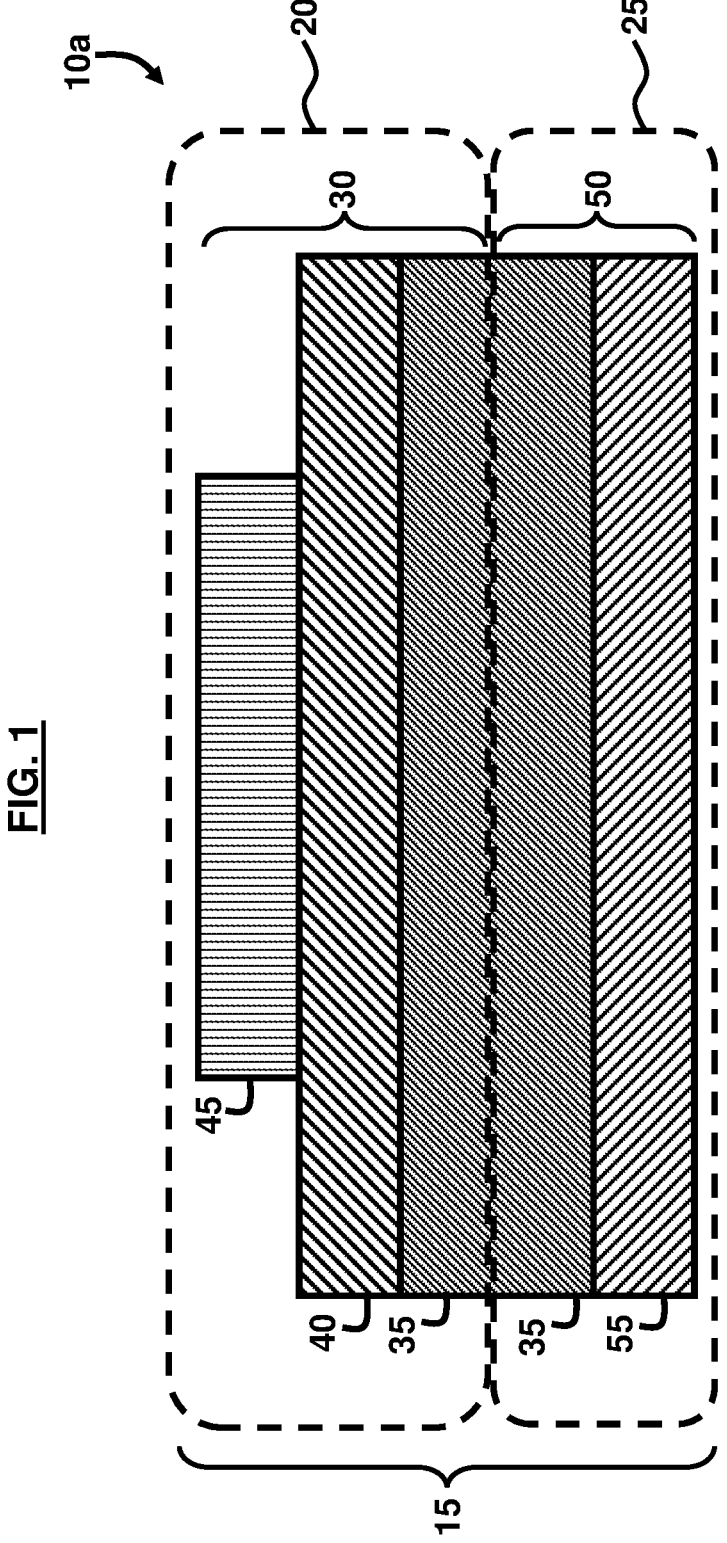
FIG. 1 is a schematic diagram illustrating a dual function diamond-based semiconductor device, according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

It will be understood that when an element or layer is referred to as being "on", "connected to", or "coupled to" another element or layer, it may be directly on, directly connected to, or directly coupled to the other element or layer, or intervening elements or layers may be present. In contrast, when an element or layer is referred to as being "directly on", "directly connected to", or "directly coupled to" another element or layer, there are no intervening elements or layers present. It will be understood that for the purposes of this disclosure, "at least one of X, Y, and Z" or "any of X, Y, and Z" may be construed as X only, Y only, Z only, or any combination of two or more items X, Y, and Z (e.g., XYZ, XY, XZ, YZ).

The description herein describes inventive examples to enable those skilled in the art to practice the embodiments herein and illustrate the best mode of practicing the embodiments herein. Upon reading the following description in light of the accompanying drawing figures, those skilled in the art will understand the concepts of the disclosure and will recognize applications of these concepts not particularly addressed herein.

Although the terms first, second, etc. may be used herein to describe various elements, but these elements should not be limited by these terms as such terms are only used to distinguish one element from another. For example, a first element could be termed a second element, and, similarly, a second element could be termed a first element, etc. without departing from the scope of the present disclosure. As used herein, the term "and/or" includes any and all combinations of one or more of the associated listed items.

Moreover, when an element is referred to as being "connected", "operatively connected", or "coupled" to another element, it can be directly connected or coupled to the other element or intervening elements may be present. Conversely, when an element is referred to as being "directly connected" or "directly coupled" to another element, there are no intervening elements present.

Furthermore, although the terms "upper", "lower", "bottom", "side", "intermediate", "middle", and "top", etc. may be used herein to describe various elements, but these elements should not be limited by these terms. These terms are only used to distinguish one element from another. For example, a first element could be termed an "upper" element and, similarly, a second element could be termed an "upper" element depending on the relative orientations of these elements.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprise(s)", "comprising", "include(s)", and/or "including" when used herein specify the presence of stated features, integers, steps, operations, elements, and/or components, but do not preclude the presence or addition of one or more other features, integers, steps, operations, elements, components, and/or groups thereof.

In contrast to unstructured diamond detectors, the embodiments herein provided a structured diamond (diode-type) detector that allows for well-controlled engineering to obtain targeted information about the radiation environment and build two independent detectors on the same diamond wafer. The embodiments herein are distinct from the conventional detectors in that the conventional detectors utilize diode-type measurements (on one or both sides of the diamond-based detector), whereas in the embodiments herein, each side is an independent detector (e.g., can be two diodes, two photoresistors, or one of each). This simplifies fabrication thereby lowering fabrication costs. The embodiments herein may be used as the sensing mechanism of a particle/radiation, and may be integrated with an electronics system to monitor, identify, and measure radiation. The electronic system will include at a minimum a bias source for the top and back detectors, amplifiers, and digital-to-analog converters.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

In semiconductor production, doping is the intentional introduction of impurities into an intrinsic semiconductor for the purpose of modulating its electrical, optical, and/or structural properties. The term "intrinsic" as applied to diamond may be considered synonymous with "undoped"; however, recognizing that it is very difficult to completely eliminate trace amounts of impurities encountered in diamond growth processes (e.g., HPHT, CVD, and VPE), the term "intrinsic" applied to diamond as used herein may also encompass "unintentionally doped" diamond material.

In some embodiments described herein, low-doped diamond material may be substituted for intrinsic diamond material. In this context, "low-doped material" refers to diamond material having p-type or n-type carriers (e.g., boron, nitrogen, phosphorous) atoms in a concentration of no greater than about $9\times10^{15}$ cm$^{-3}$, for example.

A metal contact may be an ohmic contact as described herein and is a non-rectifying electrical junction, exhibiting a linear (or substantially linear) current-voltage curve. One example of an ohmic contact suitable for use with diamond devices includes a Ti/Pt/Au electrode. A Schottky contact is a non-ohmic, metal-semiconductor contact having a large barrier height, formed when the underlying semiconductor has a lower work function than the contact metal or can arise from surface/interaction modifications. Schottky barrier height may be adjusted by various conventional means such as (but not limited to): chemical treatment (e.g., etching) of a diamond surface prior to contact formation to affect diamond surface termination, adjusting material composition of one or more contact materials (which may be in discrete layers), addition of doping material at the metal/diamond interface, thermal treatment (e.g., annealing) of contact material, and/or plasma treatment.

Neutrons present a challenge to detect efficiently, since neutrons do not carry charge or interact with electrons directly. In order to detect neutrons, a nuclear reaction with a neutron that outputs a charged energetic particle must occur first. Most commonly, the nuclear reaction produces protons, alpha particles, gamma rays, and ions. In certain devices disclosed herein, boron-containing (e.g., boron-rich) layers are used as neutron conversion layers. In another example, lithium could also be used neutron conversion layers. In some embodiments, a boron-containing layer may be provided in the form of a coating (e.g., a surface coating arranged over the surface of an underlying material). Boron naturally occurs as isotopes $^{10}$B and $^{11}$B, which occur naturally at 19.9% and 80.1%, respectively. $^{10}$B (specifically) has a high neutron capture cross section; meaning there exists a high probability that 10B will pick up a neutron that collides with the nucleus. This probability changes with the energy level of the free neutron in question, where $^{10}$B has the highest chance to pick up slow (thermal) neutrons. The thermal neutron (~0.025 eV) cross section with $^{10}$B is 3837 barn. The most common reaction of thermal neutrons (~0.025 eV) with $^{10}$B generates alpha particles (He$^{2+}$) is predominantly given by the following equation:

$$^{10}B+n(0.025\ eV)\rightarrow+^{4}He^{2+}(1.47\ MeV)+^{7}Li^{3+}+2.31\ MeV+\gamma(0.48\ MeV)$$

The interaction of the high-energy byproducts of the foregoing reaction causes a secondary reaction with the detector to ionize or excite an atom. This excitation produces a current, which acts as the signal of the detector.

According to some examples, a diamond diode-based detector device includes a boron-containing layer that is arranged to detect slow neutrons that are incident on the device. For example, the detection of slow neutrons (e.g., having energies below 0.5 eV), can be effectively accomplished by depositing a thin layer (converter) of boron or boron-containing material onto a diamond diode that acts as the charged particle detector. Such a diode may include a very thin intrinsic diamond layer to render the detector essentially insensitive to gamma radiation. A diamond diode-based detector device including a boron-containing layer may also be used to detect fast neutrons, through a nuclear reaction that generates alpha particles in addition to other byproducts. In some examples, boron (which may embody a higher proportion of $^{10}$B atoms than are present in naturally occurring boron) may be incorporated into a diamond diode-based device by boron doping of diamond, and/or by addition of at least one boron-containing non-diamond layer (e.g., boron nitride, boron carbide, boron oxide, boron, another boron compound, or a conducting metal boride).

In some embodiments, the intrinsic diamond layer comprises a thickness in a range of from approximately 10 nm to approximately 1000 μm, or from approximately 10 nm to approximately 10 μm, or from approximately 10 nm to approximately 5 μm, or from approximately 10 om to approximately 1 μm, or from approximately 100 nm to approximately 300 μm or from approximately 100 nm to approximately 10 μm, or from approximately 100 nm to approximately 1 μm, or from approximately 1 μm to approximately 300 μm, or from approximately 1 μm to approximately 100 μm, or from approximately 1 μm to approximately 50 μm, or from approximately 1 μm to approximately 10 μm, or from approximately 10 nm to approximately 5 μm, or from approximately 6 μm to approximately 300 μm. The thickness of the intrinsic diamond layer may be adjusted to affect the sensitivity of a diode-based detector device to one or more different types of radioactive decay byproducts, such as one or more of neutrons, protons, alpha particles, beta particles, X-rays, ultraviolet rays, gamma rays, and photons. For detection of neutrons, an optimal thickness of a $^{10}$B layer is close to, but less than, the range of the 1.47 MeV α-particles in $^{10}$B which is just 3.62 μm. The range in diamond of the 1.47 MeV α-particle is very close to that in $^{10}$B so its detection can indeed be accomplished with a very thin p-i-n diamond diode.

As mentioned above, boron has two primary isotopes: $^{10}$B and $^{11}$B. $^{10}$B represents 19.9%, and $^{11}$B represents 80.1%, of naturally occurring boron. In some embodiments, the boron-containing layer contains a higher proportion of $^{10}$B atoms than are present in naturally occurring boron to enhance N collection efficiency. In some embodiments, boron atoms present in a boron-containing layer comprise at least 19.9% $^{10}$B, at least 21% $^{10}$B, at least 25%, at least 30%, at least 35%, at least 40%, at least 45%, at least 50%, at least 60%, at least 70%, at least 80%, at least 90% $^{10}$B, at least 95% $^{10}$B, at least 99% $^{10}$B, or at least 99.9% $^{10}$B. In some embodiments, a boron-containing layer comprises one or more of boron nitride, boron carbide, boron oxide, boron, a metal boride (optionally an electrically conducting metal boride), or another boron compound. In some embodiments, an electrically conducting metal boride layer may serve as both a converter and an electrical contact.

The size of a diamond diode-based device suitable for neutron detection can be defined by the neutron capture layer area as it would vary according to the sensitivity to given neutron flux. The required thickness of neutron capture layer can be determined from maximum number of neutron interactions or signal obtained with respect to thickness.

Though other solid-state detectors have been described in the art, the embodiments herein may exhibit an improved ability to detect radiation in pulse mode (for more accurate particle counting) and energy measurements, at high temperatures and in real time, to operate with high efficiency, and selectively detect neutrons (versus gamma rays), or to preferentially detect protons or alpha particles. Moreover, the embodiments herein may be used in an internal gain mode for low intensity measurements (such as single event counting). As a result of an extremely high displacement energy and low Z, diamond exhibits extreme radiation hardness, which allows diamond devices to survive harsh radiation environments and results in meaningful improvements in precision and calibration. High thermal conductivity (22 W/cm K) facilitates operational temperatures higher than other solid-state detectors (e.g., up to 700° C.) and ultimately results in small device sizes by avoiding the need for cooling media. The large band gap of diamond also provides a large open-circuit voltage for solid-state radioisotope generators, and low thermal noise for radiation detectors.

Some embodiments herein are directed to devices based on single-crystal (e.g., (111), (100) and another orientation) or polycrystalline diamond-based p-i-n structure, with an intrinsic diamond layer arranged between a p-type layer and an n-type layer. The p-i-n structure creates an internal electric field, which will separate generated electron-hole pairs and cause them to move in opposite directions, resulting in a net current which can be measured or utilized by an external circuit. Because this electric field is generated by the p-i-n structure (although in some examples, the structures could be pi or ni structures), the diode-based detector devices can operate with zero external voltage. An applied bias may be used to increase the charge collection efficiency (but it will be less bias than would have been needed for unstructured diamond). If higher charge collection efficiency is desired, then an external voltage should be used.

In some embodiments, a neutron conversion layer (e.g., boron-containing layer) is added to a diamond-based pi or ni structure. For higher conversion efficiency, the boron-containing layer may contain a higher proportion of $^{10}$B atoms than are present in naturally occurring boron. An alpha particle emitted by neutron and $^{11}$B interaction produces at least one electron-hole pair in intrinsic diamond, which is collected in the form of a current signal. If the intrinsic diamond layer is sufficiently thin, then the sensitivity to gamma radiation may be reduced, thereby enabling more selective neutron detection. Diamond diode-based detectors have demonstrated charge collection length (for both electrons and holes) that exceeds 200 um (the sample thickness) at an applied field of less than 0.5 V/μm.

In some embodiments, a diamond diode-based detector device may be configured to preferentially detect energetic charged particles, alpha particles, or protons. In such an embodiment, the intrinsic diamond layer may be thin (e.g., ~10-50 μm, or another suitable thickness range) to allow efficient collection of charge, reduce recombination, and reduce sensitivity to gamma radiation. The thickness will be determined by the energy deposited into the active layer by the ionizing particle. A diamond diode-based detector may be made of single crystal or polycrystalline diamond. Because of the thin intrinsic diamond layer, polycrystalline diamond cause minimal reduction in device performance since there would be few grain boundaries to trap charge (as compared to a thick polycrystalline diamond intrinsic diamond layer). Such a device may be devoid of a neutron conversion layer, or a neutron conversion layer may be provided.

In some embodiments, a diamond diode-based detector device may include a p-i-m (i.e., "p-type, intrinsic, metal")

structure in which an intrinsic diamond layer is provided between a p-type layer and a Schottky contact (which includes a metal). Diamond diode structures may be used as detectors or may be incorporated into detectors or energy harvesting devices. Moreover, multiple devices may be fabricated in parallel on a single substrate, if desired.

Referring now to the drawings, and more particularly to FIGS. 1 through 17B, where similar reference characters denote corresponding features consistently throughout the figures, there are shown preferred embodiments. In the drawings, the size and relative sizes of components, layers, and regions, etc. may be exaggerated for clarity.

FIG. 1 illustrates a dual function diamond-based semiconductor device 10a comprising a vertically stacked structure 15 comprising a first side 20 and a second side 25. The first side 20 is oppositely positioned to the second side 25, according to an example. The device 10a further comprises a diode 30 arranged on the first side 20. The diode 30 comprises a diamond substrate 35, a first side first doped layer 40 adjacent to the diamond substrate 35, and a first side intrinsic diamond layer 45 adjacent to the first side first doped layer 40. In some examples, the diamond substrate 35 may be doped or undoped. The semiconductor device 10a further comprises a photoresistor 50 arranged on the second side 25. The photoresistor 50 comprises the diamond substrate 35 shared with the diode 30; and a second side first doped layer 55 adjacent to the diamond substrate 35.

According to an example, the first side first doped layer 40 may be positioned between the diamond substrate 35 and the first side intrinsic diamond layer 45. In an example, the first side first doped layer 40 may comprise a p or n type diamond material, although other types of materials may be used. Accordingly, the embodiments herein are not restricted to a particular type of material.

The second side first doped layer 55 could be a p-type diamond layer but could also be n-type layer or could be intrinsic or there may be no additional layer (as in device 10b of FIG. 10) or could be used just under metal to modify the contact but be etched between the metal contacts 95. If a doped diamond layer (p−, p+, n−, n+) is used only under the metal contact its purpose would be to modify the contact to make a low resistance Ohmic contact, or to modify the electric field in the active area, or to modify the electric field for internal gain.

Figure 2:
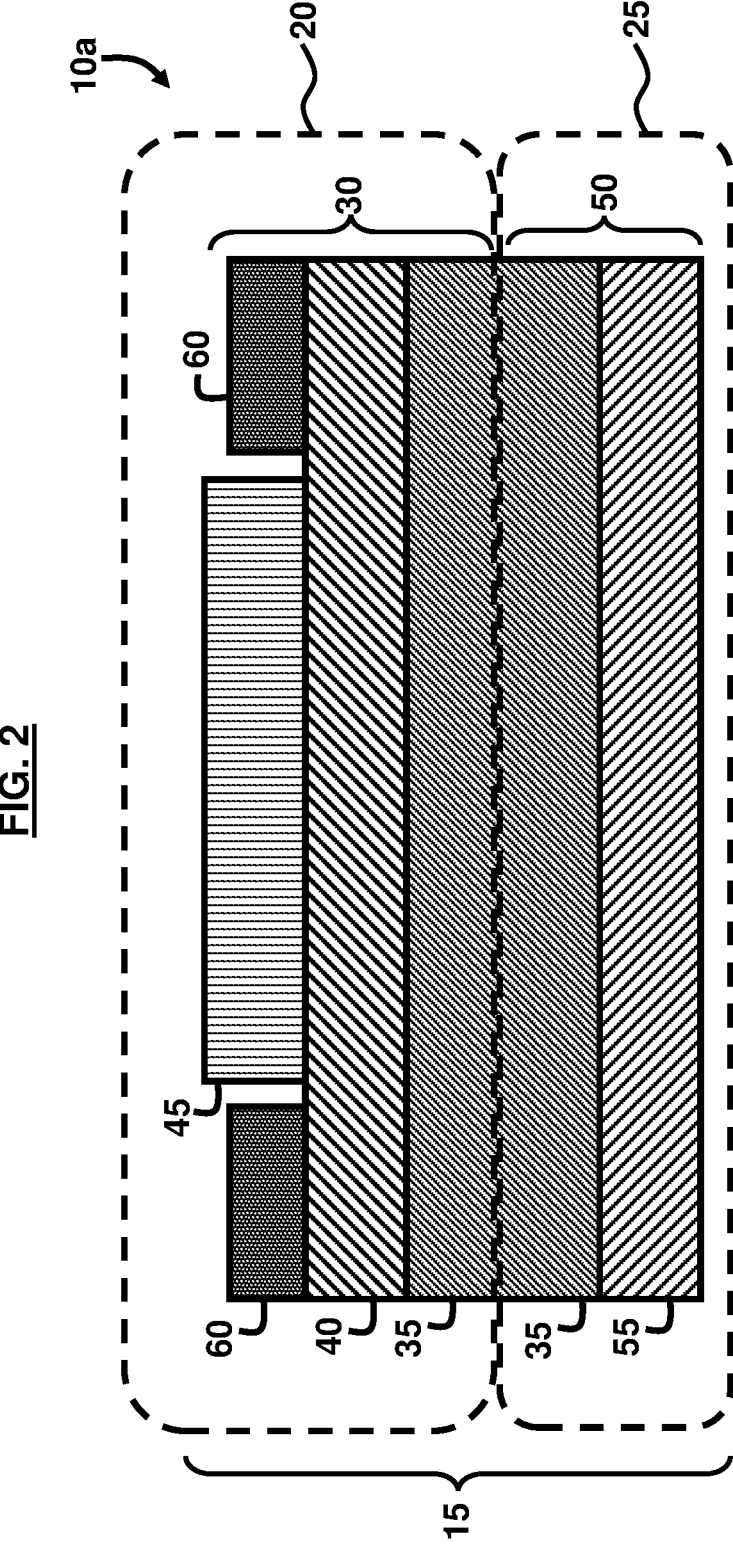
FIG. 2 is a schematic diagram illustrating the dual function diamond-based semiconductor device of FIG. 1 with a bottom metal contact for the diode, according to an embodiment herein.
Figure 3:
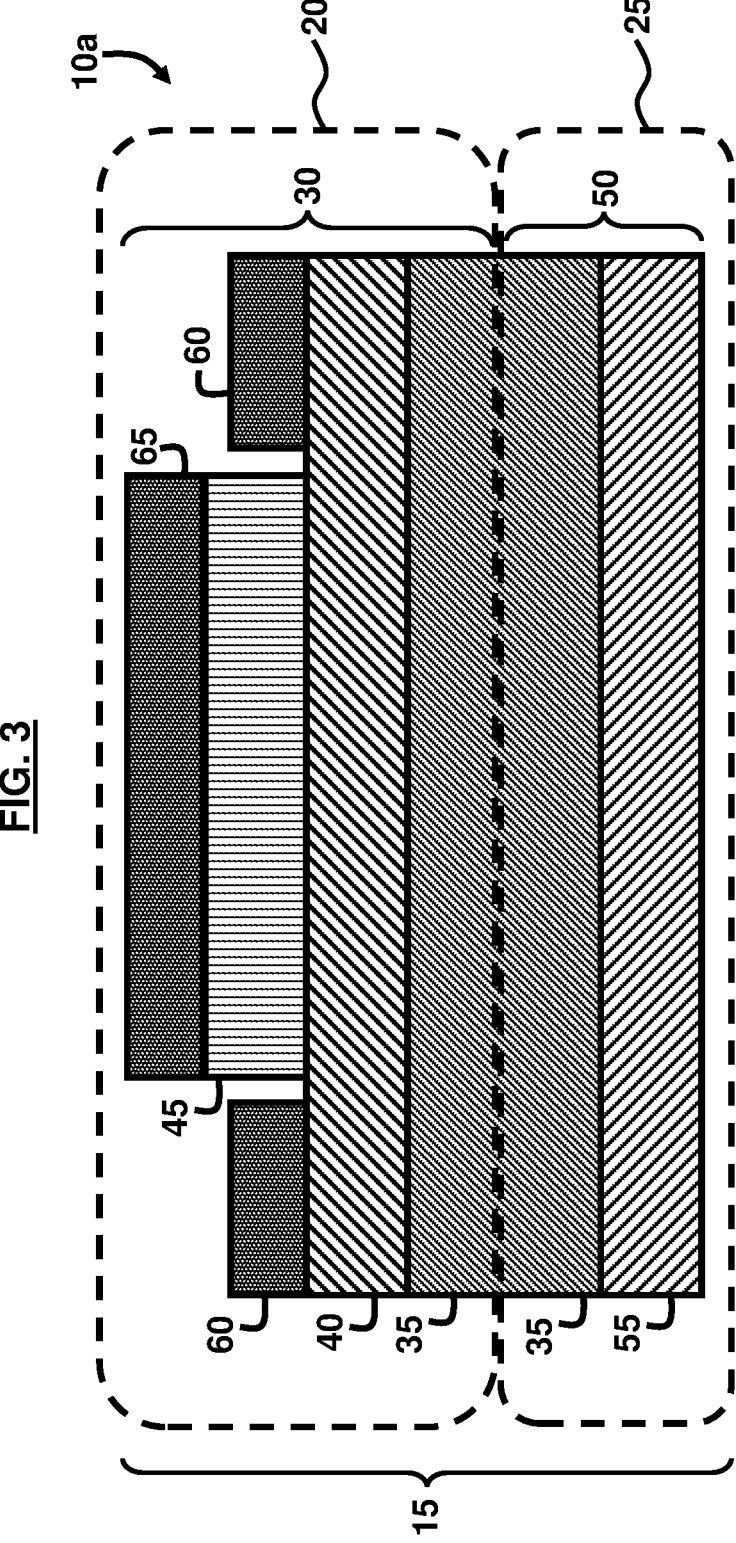
FIG. 3 is a schematic diagram illustrating the dual function diamond-based semiconductor device of FIG. 1 with another top metal contact for the diode, according to an embodiment herein.
Figure 4:
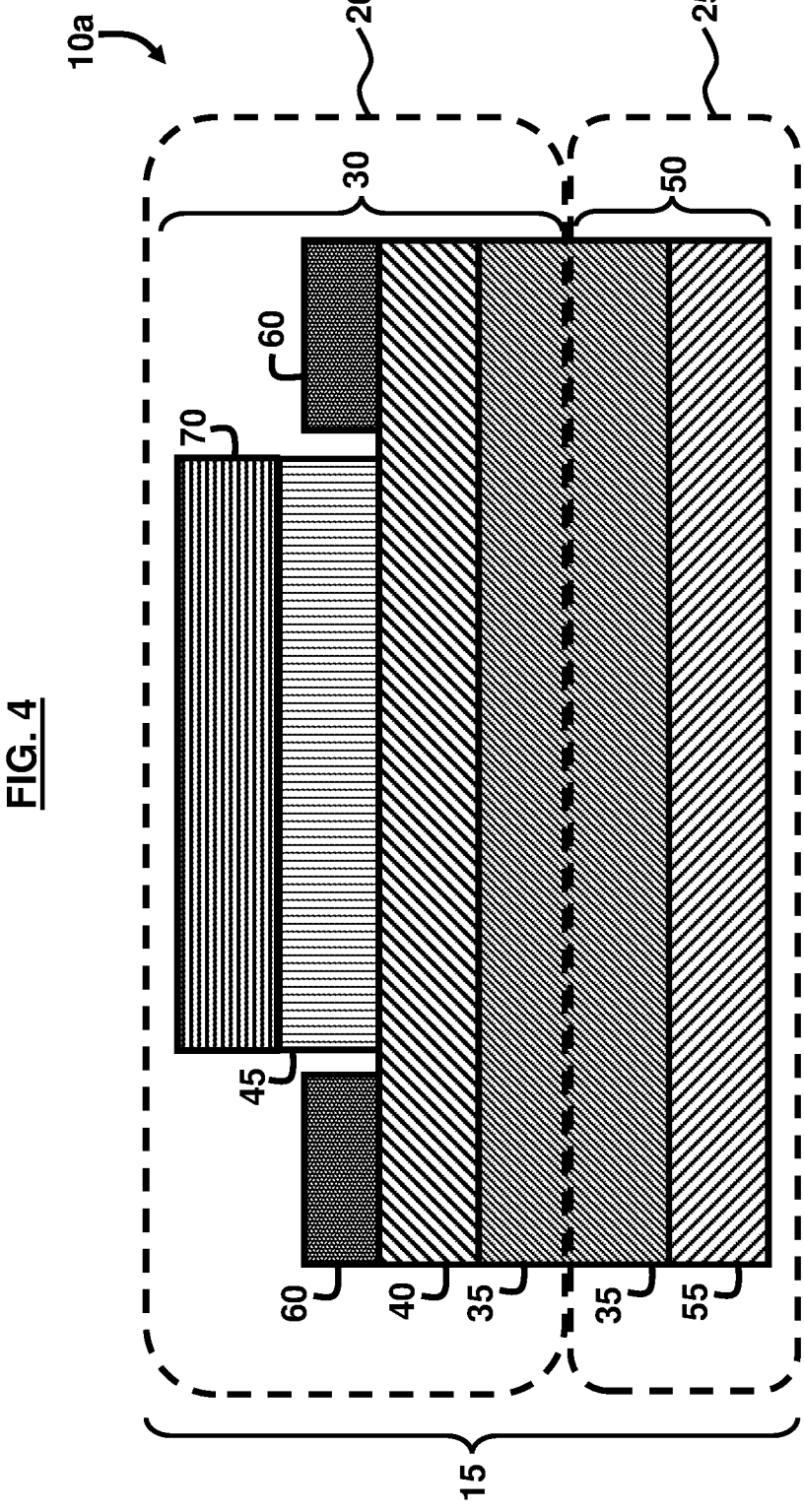
FIG. 4 is a schematic diagram illustrating the dual function diamond-based semiconductor device of FIG. 1 with a first side second doped layer, according to an embodiment herein.

FIG. 2, with reference to FIG. 1, illustrates that the diode 30 may further comprise a metal contact 60 adjacent to the first side first doped layer 40. FIG. 3, with reference to FIGS. 1 and 2, illustrates that the diode 30 may further comprise a metal contact 65 adjacent to the first side intrinsic diamond layer 45. FIG. 4, with reference to FIGS. 1 through 3, illustrates that the diode 30 may further comprise a first side second doped layer 70 adjacent to the first side intrinsic diamond layer 45. In another example, the first side second doped layer 70 may be adjacent to the first side first doped layer 40 (e.g., pn diode). In an example, the first side second doped layer 70 may comprise a p or n type diamond material, although other types of materials may be used. According to an example, the first side second doped layer 70 may be a conducting diamond layer. In an example, the first side intrinsic diamond layer 45 may be positioned between the first side first doped layer 40 and the first side second doped layer 70.

Figure 5:
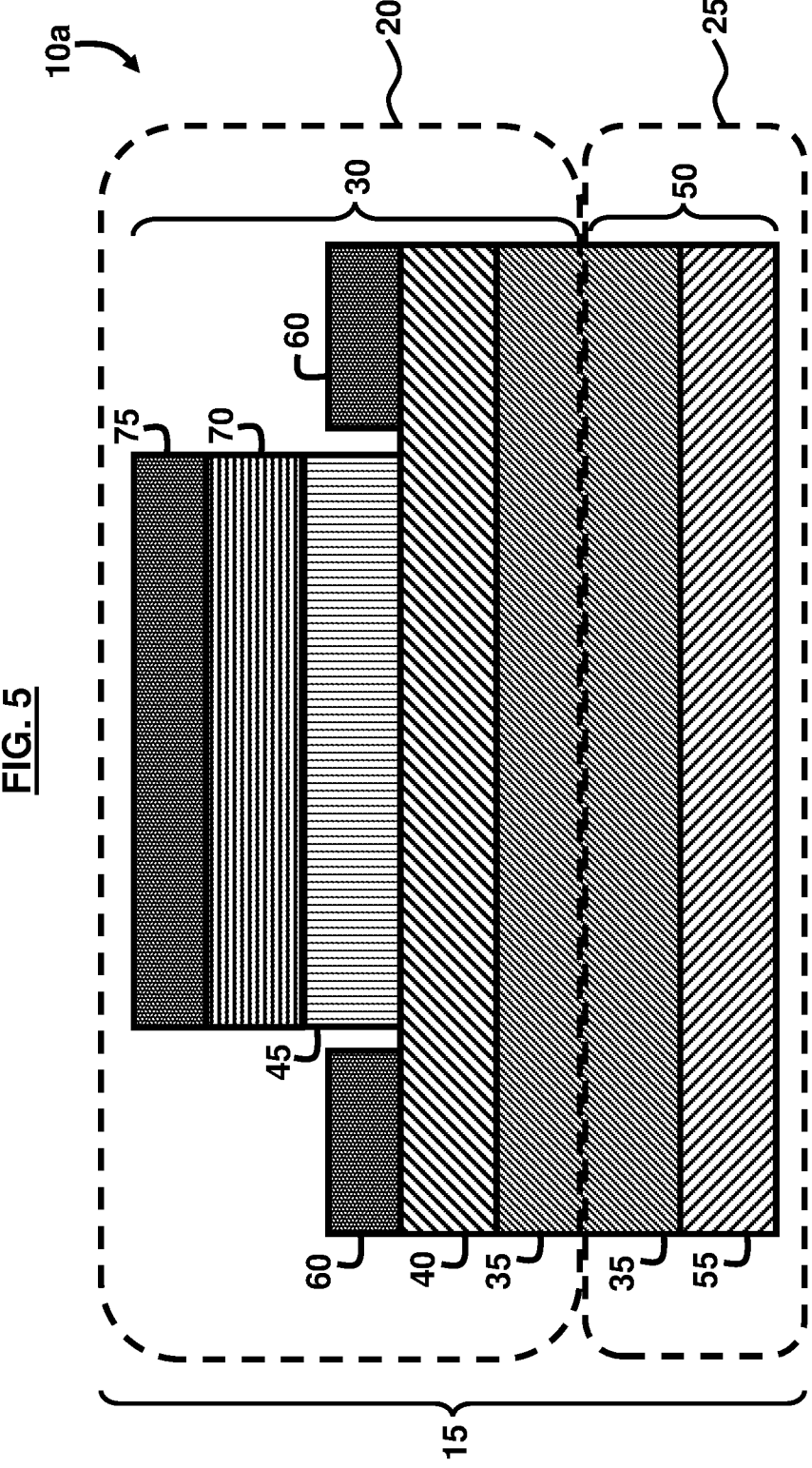
FIG. 5 is a schematic diagram illustrating the dual function diamond-based semiconductor device of FIG. 1 with another metal contact, according to an embodiment herein.
Figure 6:
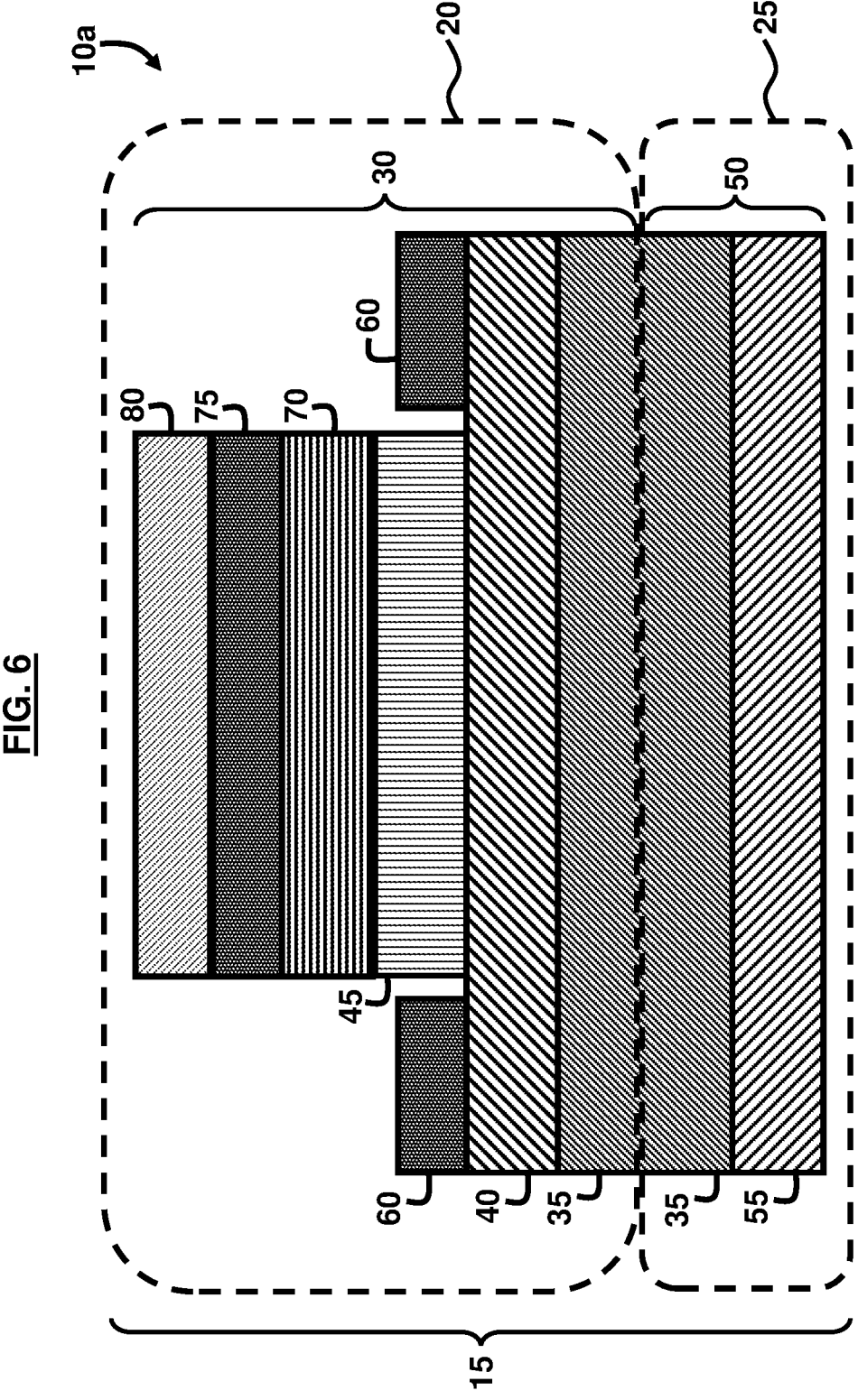
FIG. 6 is a schematic diagram illustrating the dual function diamond-based semiconductor device of FIG. 1 with a neutron conversion layer for the diode, according to an embodiment herein.

FIG. 5, with reference to FIGS. 1 through 4, illustrates that the diode 30 may further comprise a metal contact 75 adjacent to the first side second doped layer 70. FIG. 6, with reference to FIGS. 1 through 5, illustrates that the diode 30 may further comprise a neutron conversion layer 80 adjacent to the metal contact 75. According to an example, the metal contact 75 may be positioned between the neutron conversion layer 80 and the first side second doped layer 70 or the first side intrinsic diamond layer 45. In some examples, each of the first side first doped layer 40, the second side first doped layer 55, the first side intrinsic diamond layer 45, and the first side second doped layer 70 may comprise a single crystal material, polycrystalline material, or a nanocrystalline material.

Figure 7:
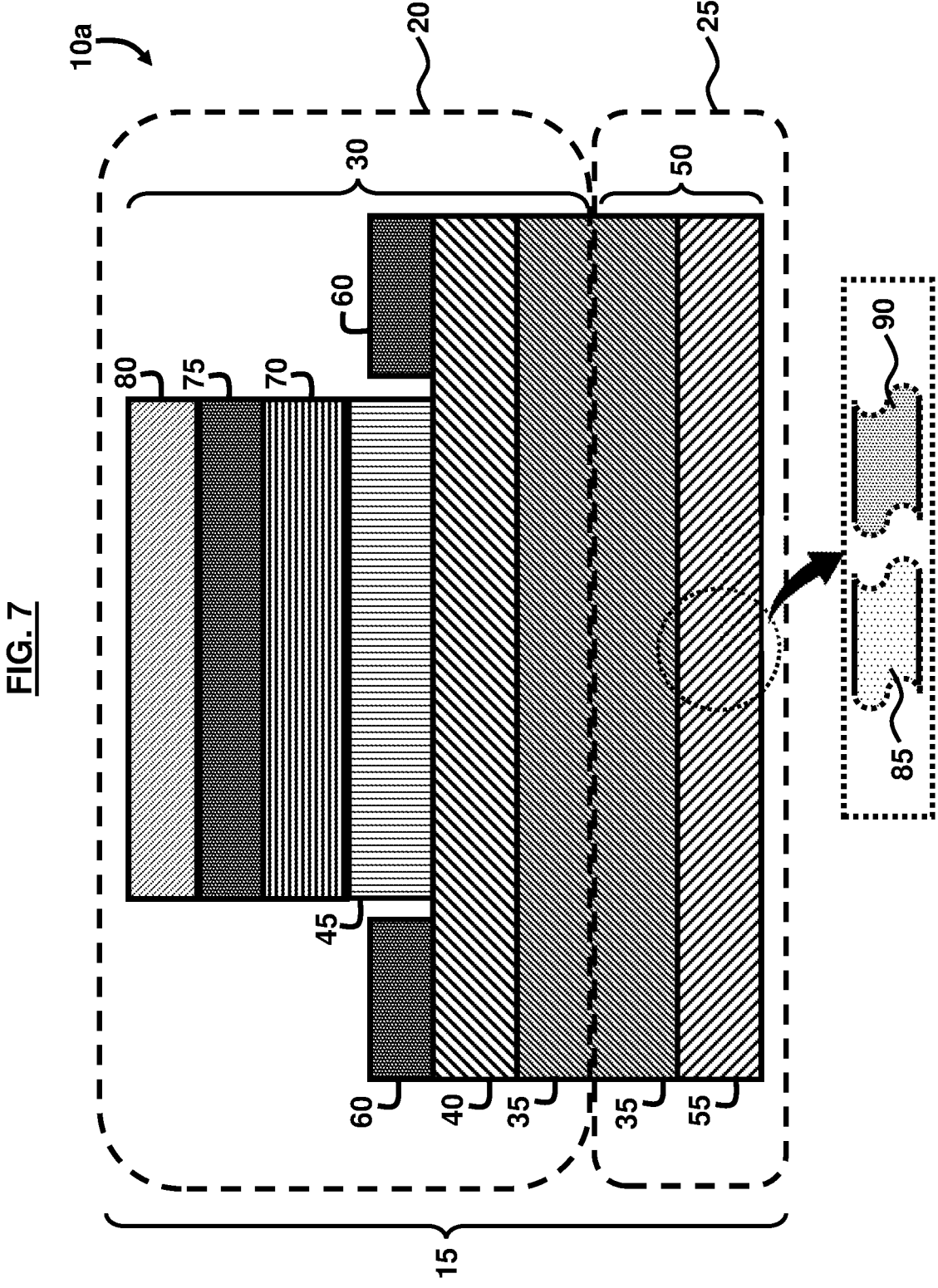
FIG. 7 is a schematic diagram illustrating the dual function diamond-based semiconductor device of FIG. 1 with example layers of the second side first doped layer, according to an embodiment herein.

According to an example, the second side first doped layer 55 may comprise a p-type diamond material, a n-type diamond layer, a second side intrinsic diamond layer 85 (as shown in FIG. 7, with reference to FIGS. 1 through 6), and/or an additional low resistance layer comprising a p or n diamond or conducting nanocarbon layer 90 (as shown in FIG. 7) adjacent to the diamond substrate 35. However, these are merely examples, and the embodiments herein are not restricted to these or any particular type of materials. Furthermore, in some examples, a combination of different materials may be utilized.

Figure 8:
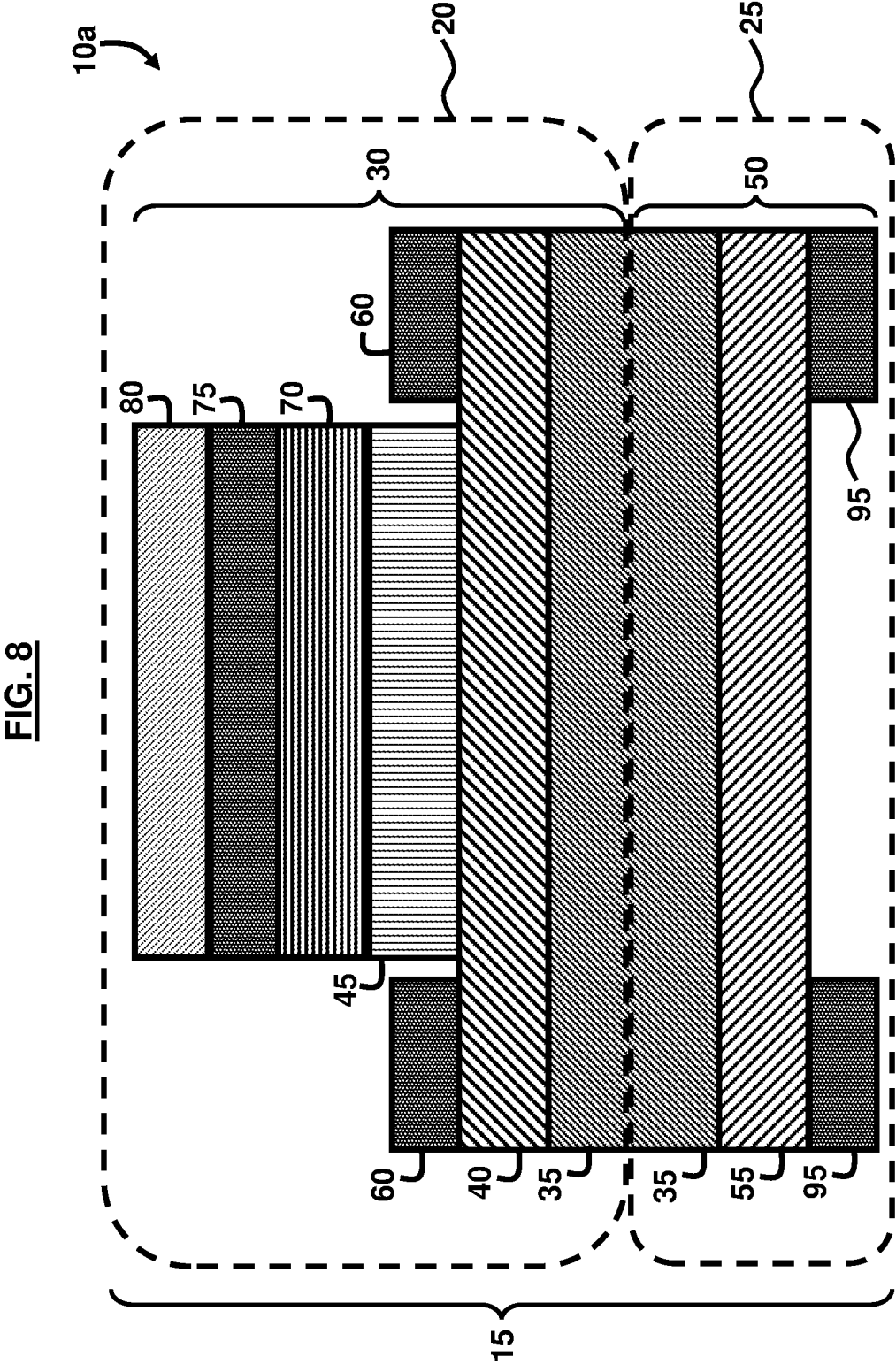
FIG. 8 is a schematic diagram illustrating the dual function diamond-based semiconductor device of FIG. 1 with a metal contact for the photoresistor, according to an embodiment herein.
Figure 9A:
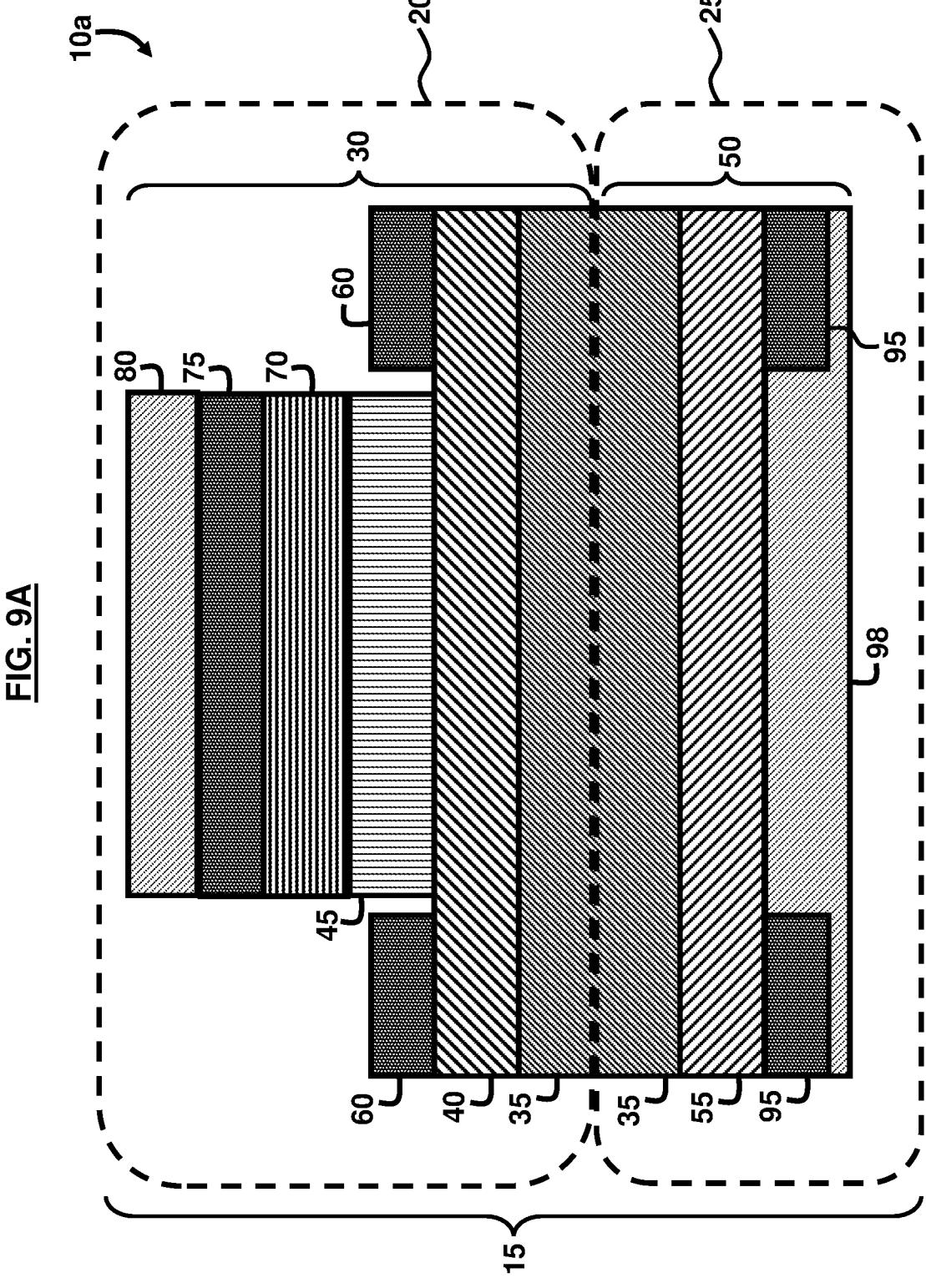
FIG. 9A is a schematic diagram illustrating the dual function diamond-based semiconductor device of FIG. 1 with a neutron conversion layer for the photoresistor, according to an embodiment herein.
Figure 9B:
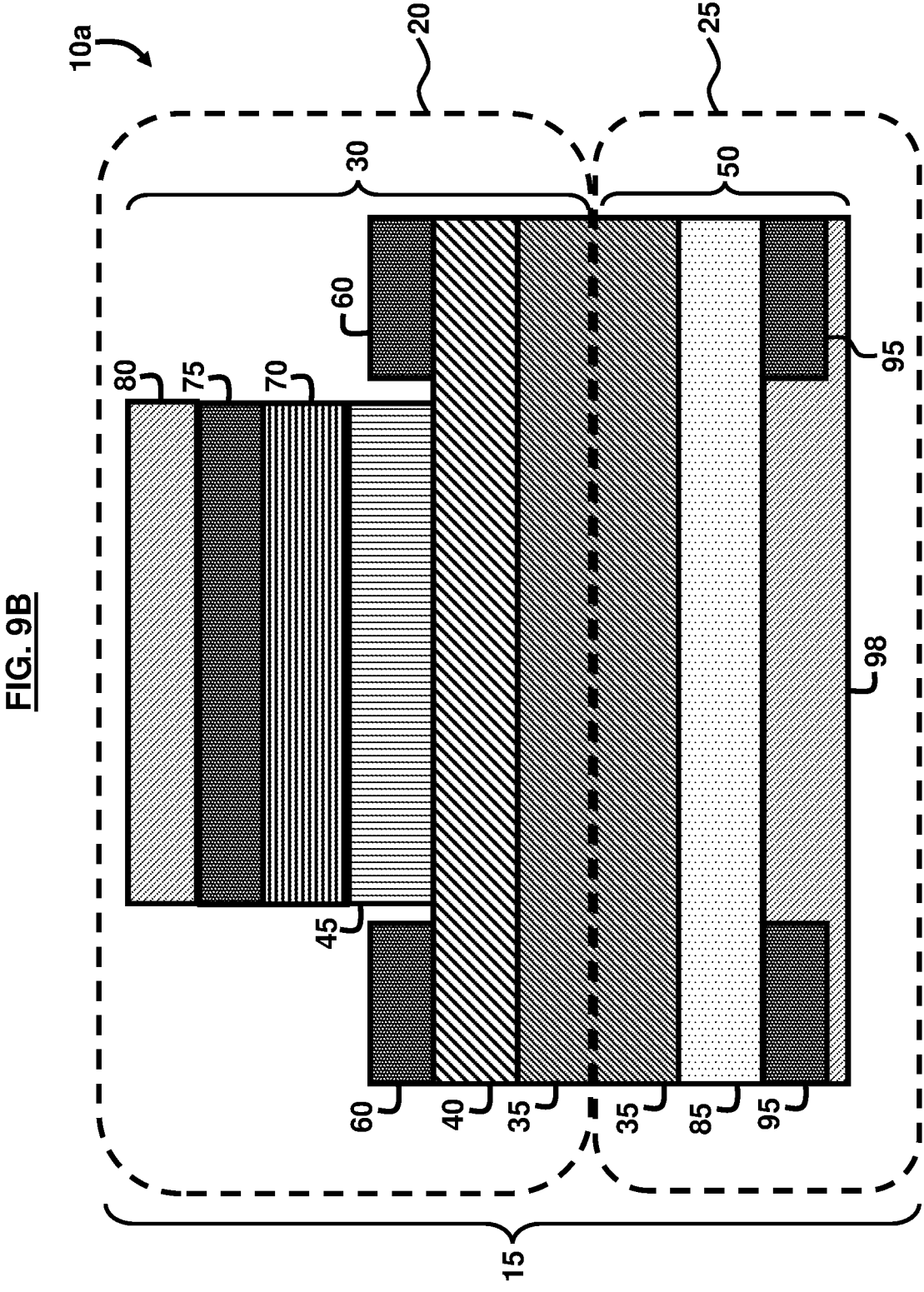
FIG. 9B is a schematic diagram illustrating the dual function diamond-based semiconductor device of FIG. 9A with a second side intrinsic diamond layer replacing the second side first doped layer, according to an embodiment herein.
Figure 9C:
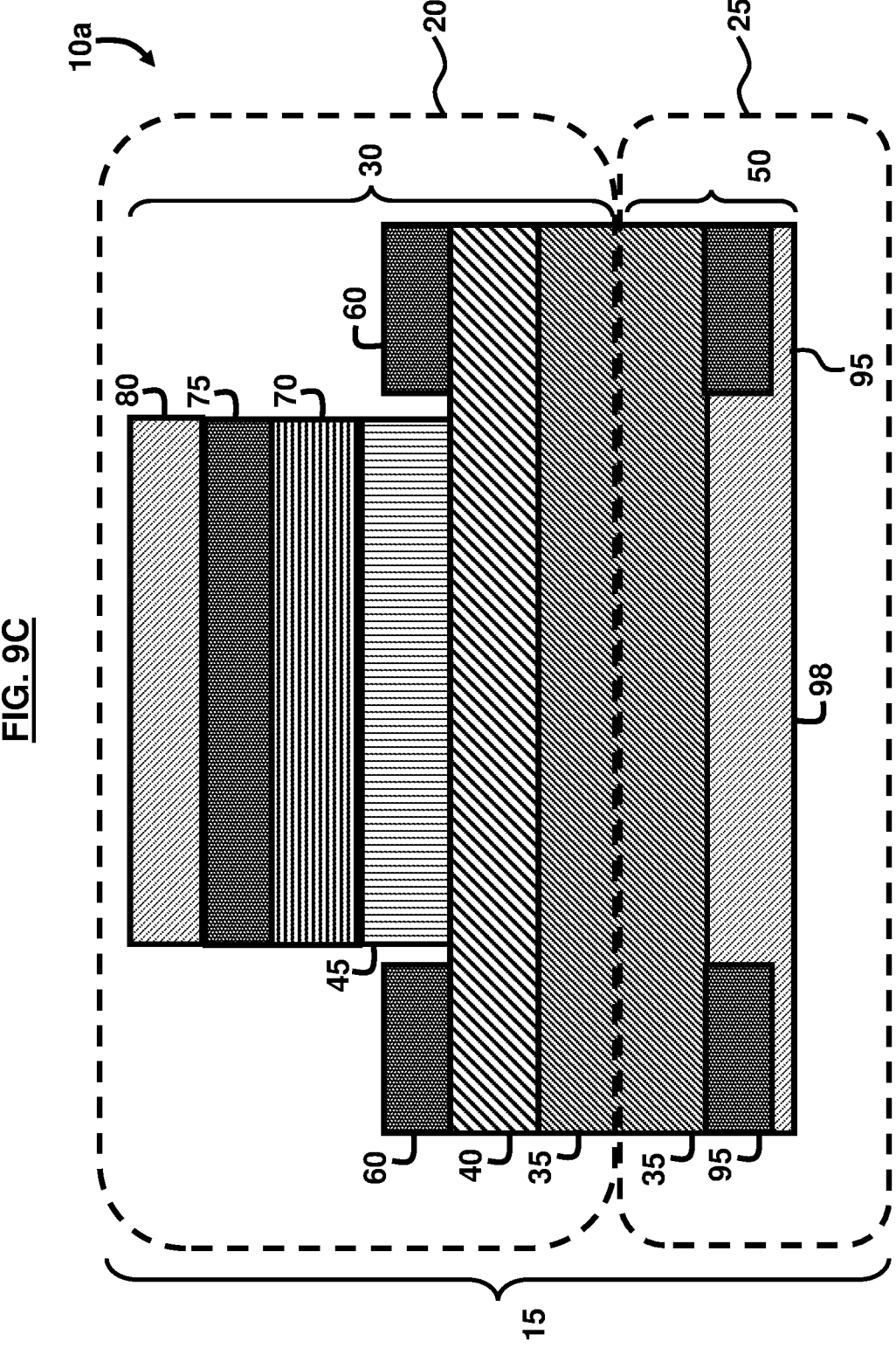
FIG. 9C is a schematic diagram illustrating the dual function diamond-based semiconductor device of FIGS. 9A and 9B without a second side first doped layer or a second side intrinsic diamond layer, according to an embodiment herein.

FIG. 8, with reference to FIGS. 1 through 7, illustrates that the photoresistor 50 may further comprise a metal contact 95 adjacent to the second side first doped layer 55. In FIG. 8, metal contacts 60 are electrically connected to each other but metal contacts 95 and 95 are not electrically connected to each other. For example, the metal contacts 60 may be a single ring-like structure encircling the stack (e.g., first side intrinsic diamond layer 45, first side second doped layer 70, metal contact 75, and neutron conversion layer 80). FIG. 9A, with reference to FIGS. 1 through 8, illustrates that the photoresistor 50 may further comprise a neutron conversion layer 98 adjacent to the second side first doped layer 55 and the metal contact 95 such that the metal contact 95 also contacts the second side first doped layer 55. In an example, the second side first doped layer 55 may be positioned between the diamond substrate 35 and the neutron conversion layer 98. Alternatively, as shown in the example of FIG. 9B, with reference to FIGS. 1 through 9A, a second side intrinsic diamond layer 85 replaces the second side first doped layer 55. In such an example configuration, the metal contact 95 and neutron conversion layer 98 are adjacent to the second side intrinsic diamond layer 85 such that the metal contact 95 also contacts the second side intrinsic diamond layer 85. Still alternatively, as shown in the example of FIG. 9C, with reference to FIGS. 1 through 9B, the device 10*a* is without a second side first doped layer 55 or a second side intrinsic diamond layer 85. Rather, the metal contact 95 and the neutron conversion layer 98 are adjacent to the diamond substrate 35 such that the metal contact 95 also contacts the diamond substrate 35. As shown in FIG. 9A, the metal contact 95 may be positioned between the second side first doped layer 55 and the neutron conversion layer 98, in an example. As shown in FIG. 9B, the metal contact 95 may be positioned between the second side intrinsic diamond layer 85 and the neutron conversion layer 98, according to an example. Moreover, as shown in FIG. 9C, the metal contact 95 may be positioned between the diamond substrate 35 and the neutron conversion layer 98.

According to some examples, the various layers 35, 40, 45, 55, 85, 70, 85, 90 may be fabricated by chemical vapor deposition (CVD) techniques, and the metal contacts 60, 75, 95 may be fabricated by e-beam deposition, sputtering, or any other suitable metal deposition technique. The first side intrinsic diamond layer 45 may have a thickness value according to one of the thickness ranges specified herein, for example. In some embodiments, the layers 40, 45, 55, 85, 70 each comprise single crystal (e.g., (111), (100), or other orientation) diamond, with the layer 55 incorporating a p-type dopant (e.g., B). Leads (not shown) may be provided to couple the metal contacts 60, 75, 95 with an external circuit (not shown). In some embodiments, the layers 40, 45, 55, 85, 70 may each comprise polycrystalline material.

To take advantage of the single-crystal diamond properties-such as high breakdown field, high hole and electron mobility, and high thermal conductivity-p-type single-crystal diamond may be used as an initial substrate in some embodiments. Single-crystal intrinsic diamond and single crystal n-type diamond layers may then be deposited using plasma-enhanced chemical vapor deposition (PECVD). The intrinsic region will become conducting due to charge carriers injected by n- and p-type diamond with applied voltage. The wide band gap of intrinsic diamond enables near zero dark current at room temperature; accordingly, the dark current in diamond p-i-n diodes is zero. By varying the thickness of the intrinsic diamond layers 45, 85, the breakdown voltage of a p-i-n diode device can be tuned. Moreover, the sensitivity to various radiation species can be tuned. In addition, the material properties of intrinsic diamond make it the ideal material to withstand extremely high voltages and efficiently conduct both electron and hole currents. Furthermore, diamond is tolerant to harsh conditions and extreme radiation environments.

The metal contacts 60 are separated from one another by segregating regions therebetween that are optionally filled with insulating material (not shown). In some embodiments, the segregating regions may be formed by conventional methods such as photolithographic patterning and etching, or by sawing (e.g., using a wire saw). In some embodiments, the metal contacts 95 may be provided and arranged in parallel, and the metal contacts 60 may be provided and arranged in parallel, with the contacts 95 extending in a lengthwise direction perpendicular to a lengthwise direction of the contacts 60. Such a configuration may provide overlapping "stripes" of contacts that permit diode regions at intersections of the contacts to be operated simultaneously (e.g., as radioactive decay product detectors or energy harvesting devices).

In some embodiments, the device 10*a* may be devoid of a boron-containing layer, but the first side intrinsic diamond layer 45 thereof (either single crystal or polycrystalline diamond) may act as an active layer for incident protons and/or alpha particles. In some embodiments, the first side intrinsic diamond layer 45 may be optimized to match the absorption depth (about 5 μm) of approximately 2 MeV alpha particles. The thin first side intrinsic diamond layer 45 may be sensitive to alpha particles and protons but can exhibit reduced or minimal sensitivity to other charged particles and gamma radiation. Metal contacts 60 may be provided to collect charge generated in the first side intrinsic diamond layer 45. Charge created in the first side intrinsic diamond layer 45 is collected efficiently, as a result of induced electric field across thin intrinsic diamond layer p-i-n diamond-based semiconductor device 10*a*, in the form of a radiation signal.

Figure 10:
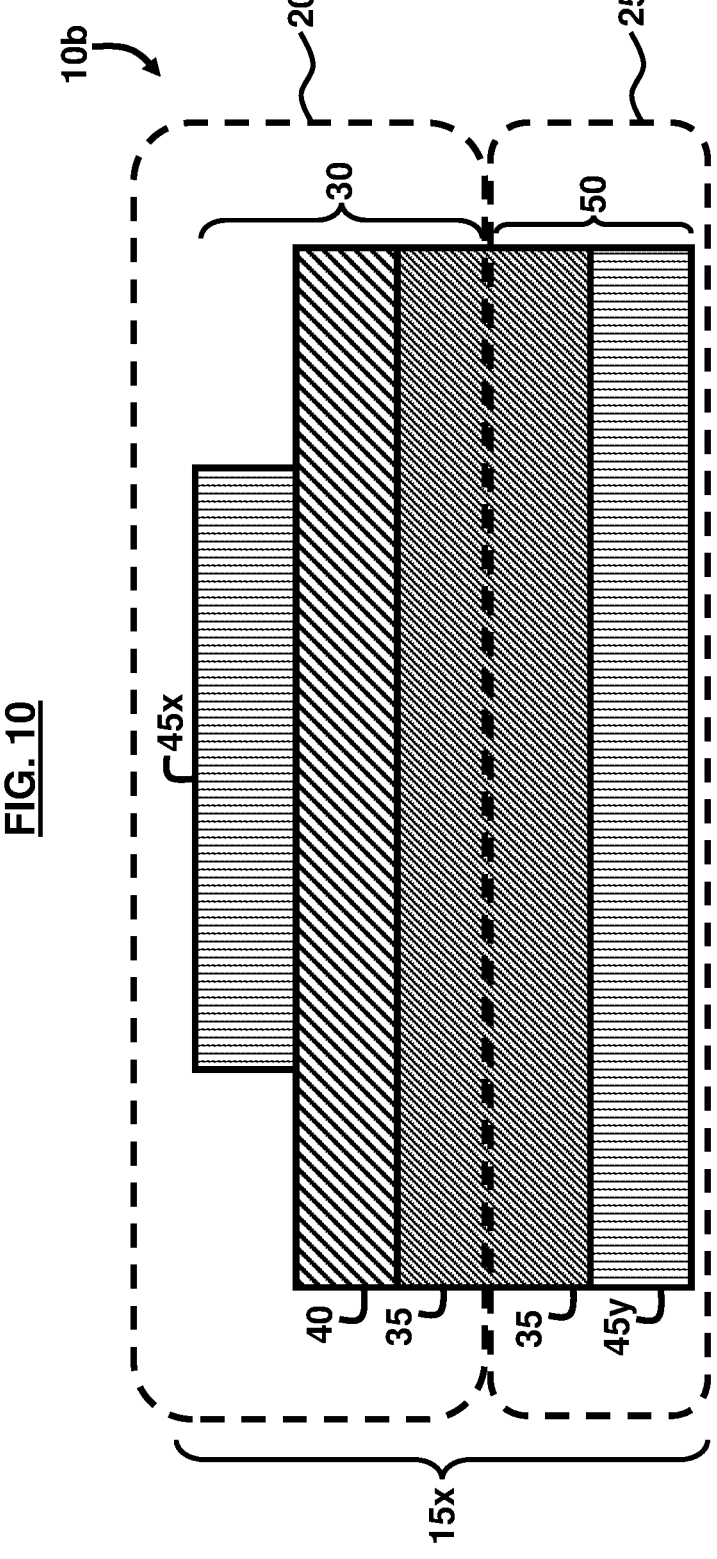
FIG. 10 is a schematic diagram illustrating a dual function diamond-based semiconductor device, according to another embodiment herein.

FIG. 10, with reference to FIGS. 1 through 9C, illustrates a dual function diamond-based semiconductor device 10*b* comprising a vertically stacked structure 15*x* comprising a first side 20 and a second side 25. The first side 20 is oppositely positioned to the second side 25. A diode 30 is arranged on the first side 20. The diode 30 comprises a diamond substrate 35, a first side first doped layer 40 adjacent to the diamond substrate 35, and a first side intrinsic diamond layer 45*x* adjacent to the first side first doped layer 40. The diamond substrate 35 may be doped or undoped, according to some examples. The semiconductor device 10*b* further comprises a photoresistor 50 arranged on the second side 25. The photoresistor 50 comprises the diamond substrate 35 shared with the diode 30, and a second side intrinsic diamond layer 45*y* adjacent to the diamond substrate 35.

According to some examples, the various layers 40, 45*x*, 45*y* may be fabricated by CVD techniques, and the metal contacts (not shown in FIG. 10) may be fabricated by e-beam deposition, sputtering, or any other suitable metal deposition technique. The intrinsic diamond layers 45*x*, 45*y* may have a thickness value according to one of the thickness ranges specified herein, for example. In some embodiments, the layers 40, 45*x*, 45*y* each comprise single crystal (e.g., (111), (100), or other orientation) or polycrystalline diamond. Leads (not shown) may be provided to couple the metal contacts (not shown in FIG. 10) with an external circuit (not shown). In some embodiments, the layers 40, 45*x*, 45*y* may each comprise polycrystalline material.

In some embodiments, the device 10*b* may be devoid of a boron-containing layer, but the intrinsic diamond layers 45*x*, 45*y* thereof (either single crystal or polycrystalline diamond) may act as an active layer for incident protons and/or alpha particles. In some embodiments, the intrinsic diamond layers 45*x*, 45*y* may be optimized to match the absorption depth (about 5 μm) of approximately 2 MeV alpha particles. The thin intrinsic diamond layers 45*x*, 45*y* may be sensitive to alpha particles and protons but can exhibit reduced or minimal sensitivity to other charged particles and gamma radiation. Metal contacts (not shown in FIG. 10) may be provided to collect charge generated in the intrinsic diamond layers 45*x*, 45*y*. Charge created in intrinsic diamond layers 45*x*, 45*y* is collected efficiently, as a result of induced electric field across thin intrinsic diamond layer p-i-n diamond-based semiconductor device 10*b*, in the form of a radiation signal.

In some embodiments, a radioisotope source (not shown) may be combined with one or more diamond diode-based devices 10*b* to form a radioisotope generator or energy harvesting device. The structure and working principle of a diamond diode-based solid-state radioisotope generator is similar to that of the diamond diode and diamond diode detector devices described herein. In some embodiments, CVD grown intrinsic diamond may be arranged between n-type and p-type diamond in a p-i-n diode structure. Alternatively, CVD grown intrinsic diamond (or low-doped p-type diamond) may be arranged between p-type diamond and a Schottky contact in a Schottky diode structure. In either instance, a radioisotope source (e.g., a radioactive isotope foil) is arranged proximate to the diamond diode device 10*b*. Energetic particles absorbed in the first side intrinsic diamond layer 45 (possibly substituted with a low-doped p-type layer) excite electron-hole pairs, which are split by the internal electric field. This results in a current which can be directed to a load. The energetic particle source may be a radioactive isotope such as tritium, Pm-147, Ni-63, Sr-90, Pu-238, Te-99, Cm-244, Sr-90, C-14, or nuclear waste material. In some embodiments, carbon-14 may be arranged internal to the diamond diode structure. To increase the conversion efficiency of a radioisotope generator or energy harvesting device and minimize the need for shielding, the diamond diode device 10*b* as disclosed herein may be repeated on two opposing surfaces of a radioisotope source. In some embodiments, multiple diamond diode structures as disclosed herein (optionally provided in one or more physically interconnected array-type devices) may be arranged in parallel along one or multiple surfaces of a radioisotope source.

Figure 11:
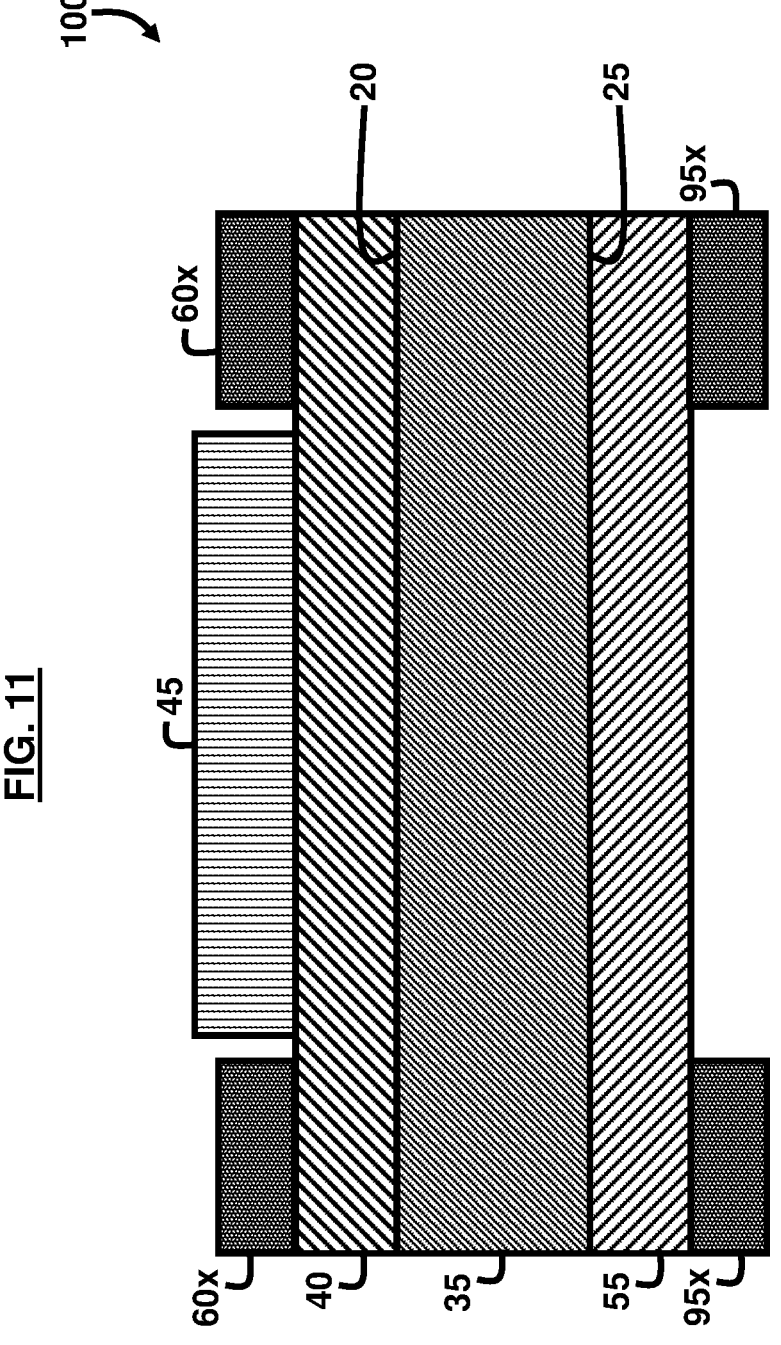
FIG. 11 is a schematic diagram illustrating a diamond-based particle detector, according to an embodiment herein.

FIG. 11, with reference to FIGS. 1 through 10, illustrates a diamond-based particle detector 100 comprising a diamond substrate 35 (which may be doped or undoped) comprising a first side 20 and a second side 25, a first side first doped layer 40 contacting the first side 20 of the diamond substrate 35, a first metal contact 60*x* contacting the first side first doped layer 40, a first side intrinsic diamond layer 45 contacting the first side first doped layer 40. The first side first doped layer 40 is positioned between the diamond substrate 35 and the first side intrinsic diamond layer 45. A second side first doped layer 55 is provided contacting the second side of the diamond substrate 35, and a second metal contact 95*x* is provided contacting the second side first doped layer 55.

Figure 12:
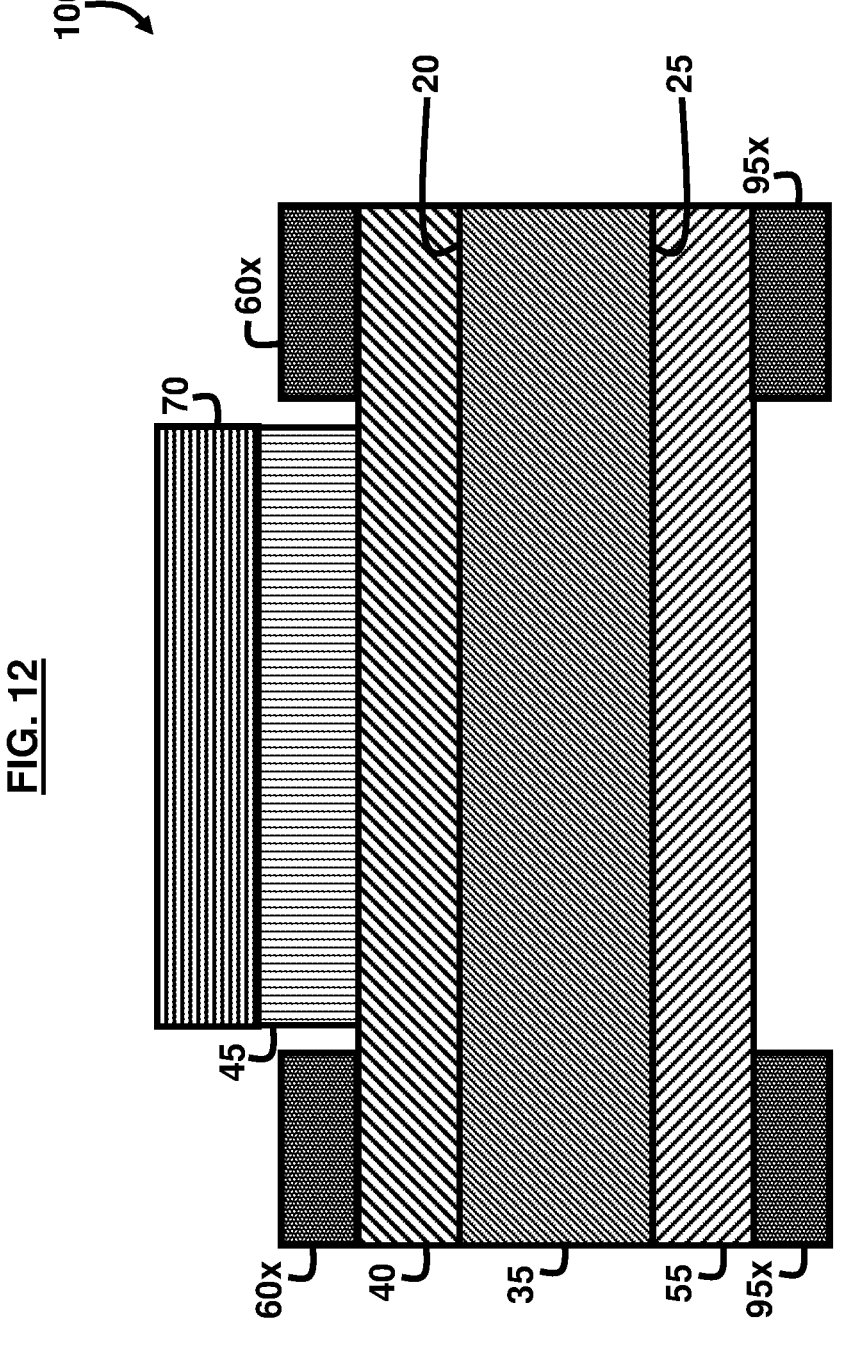
FIG. 12 is a schematic diagram illustrating the diamond-based particle detector of FIG. 11 with a first side second doped layer, according to an embodiment herein.
Figure 13:
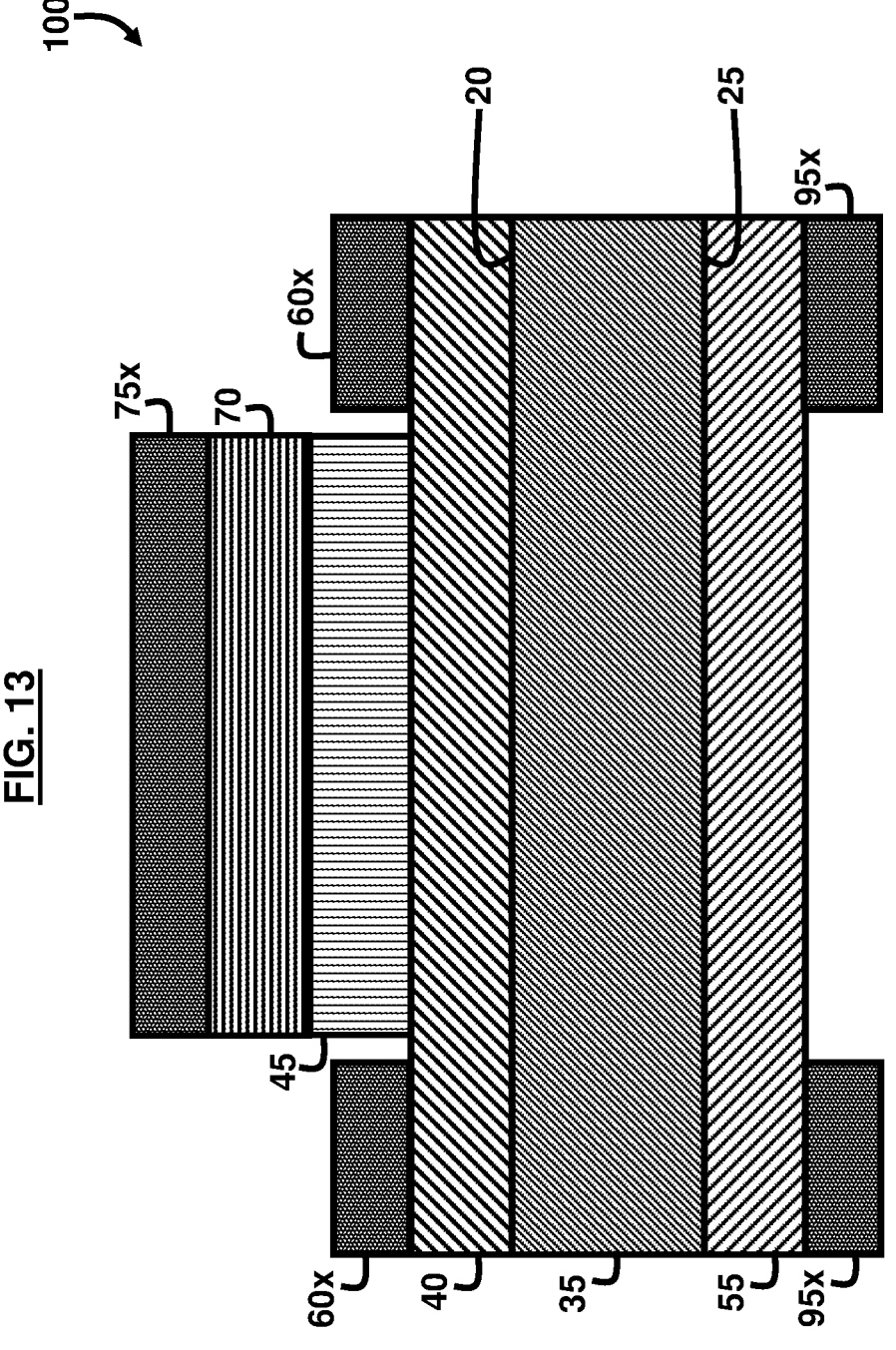
FIG. 13 is a schematic diagram illustrating the diamond-based particle detector of FIG. 11 with another metal contact, according to an embodiment herein.
Figure 14:
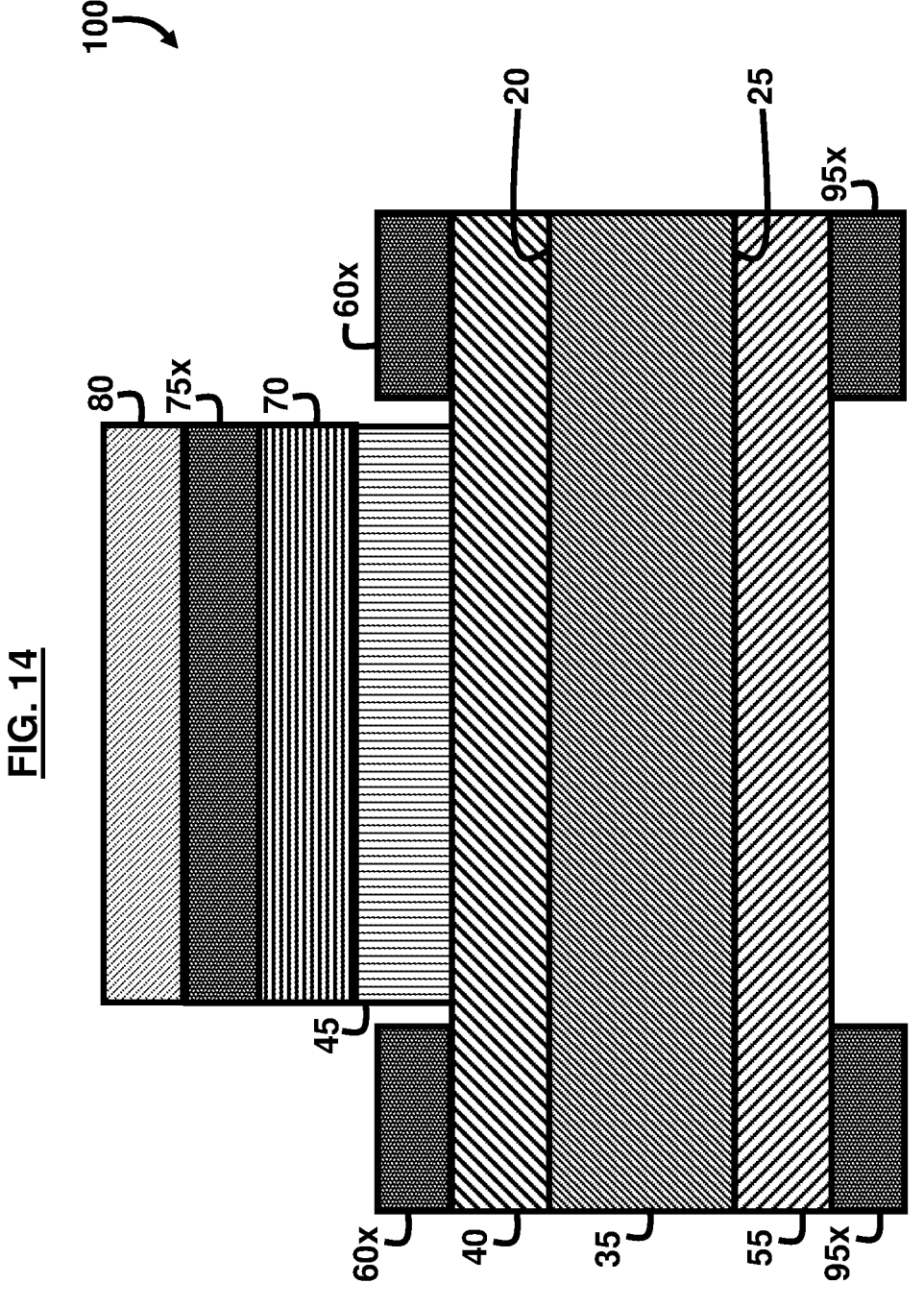
FIG. 14 is a schematic diagram illustrating the diamond-based particle detector of FIG. 11 with a neutron conversion layer contacting a metal contact, according to an embodiment herein.

FIG. 12, with reference to FIGS. 1 through 11, illustrates that the diamond-based particle detector 100 may further comprise a first side second doped layer 70 contacting the first side intrinsic diamond layer 45. FIG. 13, with reference to FIGS. 1 through 12, illustrates that the diamond-based particle detector 100 may further comprise a third metal contact 75*x* contacting the first side second doped layer 70. FIG. 14, with reference to FIGS. 1 through 13, illustrates that the diamond-based particle detector 100 may further comprise a neutron conversion layer 80 contacting the third metal contact 75*x*.

Figure 15A:
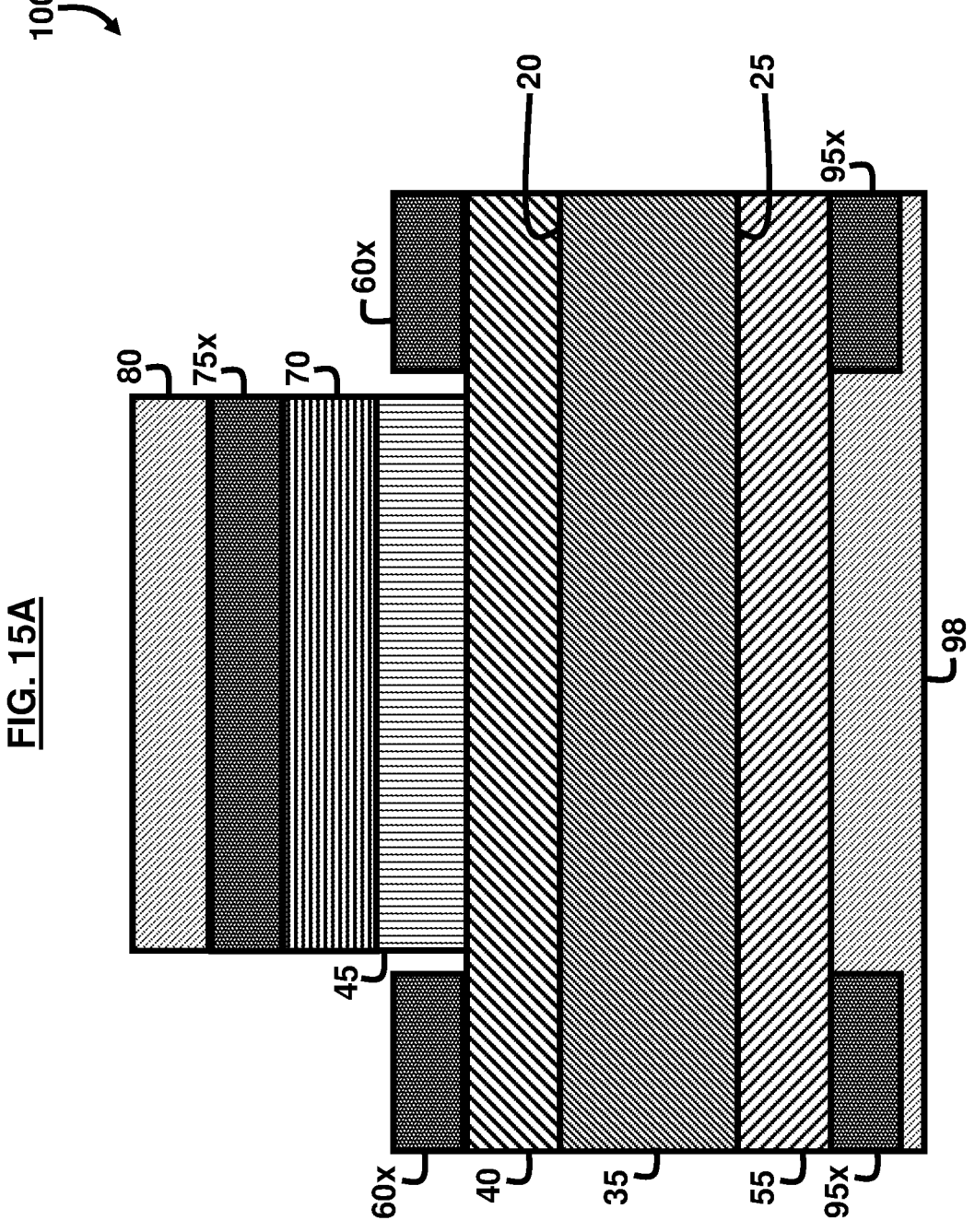
FIG. 15A is a schematic diagram illustrating the diamond-based particle detector of FIG. 11 with a neutron conversion layer contacting the second side first doped layer and a metal contact, according to an embodiment herein.

In an example, FIG. 15A, with reference to FIGS. 1 through 14, illustrates that the diamond-based particle detector 100 may further comprise a neutron conversion layer 98 contacting the second side first doped layer 55 and the second metal contact 95*x* such that the second metal contact 95*x* also contacts the second side first doped layer 55. In an example, FIG. 15B, with reference to FIGS. 1 through 15A, illustrates a diamond-based particle detector 100 comprising a diamond substrate 35 comprising a first side 20 and a second side 25, a first side first doped layer 40 contacting the first side 20 of the diamond substrate 35, a first metal contact 60*x* contacting the first side first doped layer 40, a first side intrinsic diamond layer 45 contacting the first side first doped layer 40, a second side intrinsic diamond layer 85 contacting the second side 25 of the diamond substrate 35; and a second metal contact 95*x* contacting the second side intrinsic diamond layer 85. The first side first doped layer 40 is positioned between the diamond substrate 35 and the intrinsic diamond layer 45.

Figure 15B:
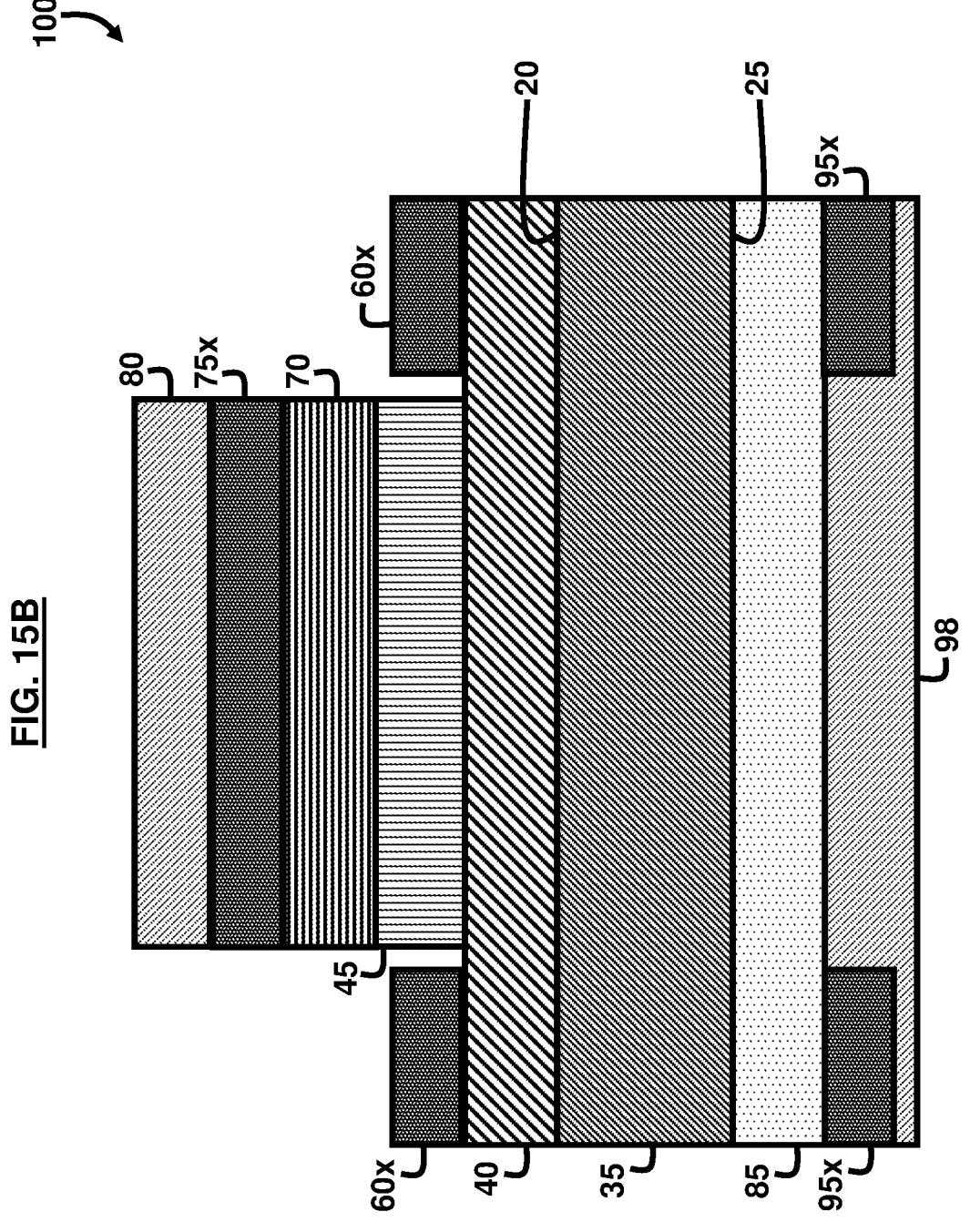
FIG. 15B is a schematic diagram illustrating the diamond-based particle detector of FIG. 15A with a second side intrinsic diamond layer replacing the second side first doped layer, according to an embodiment herein.
Figure 15C:
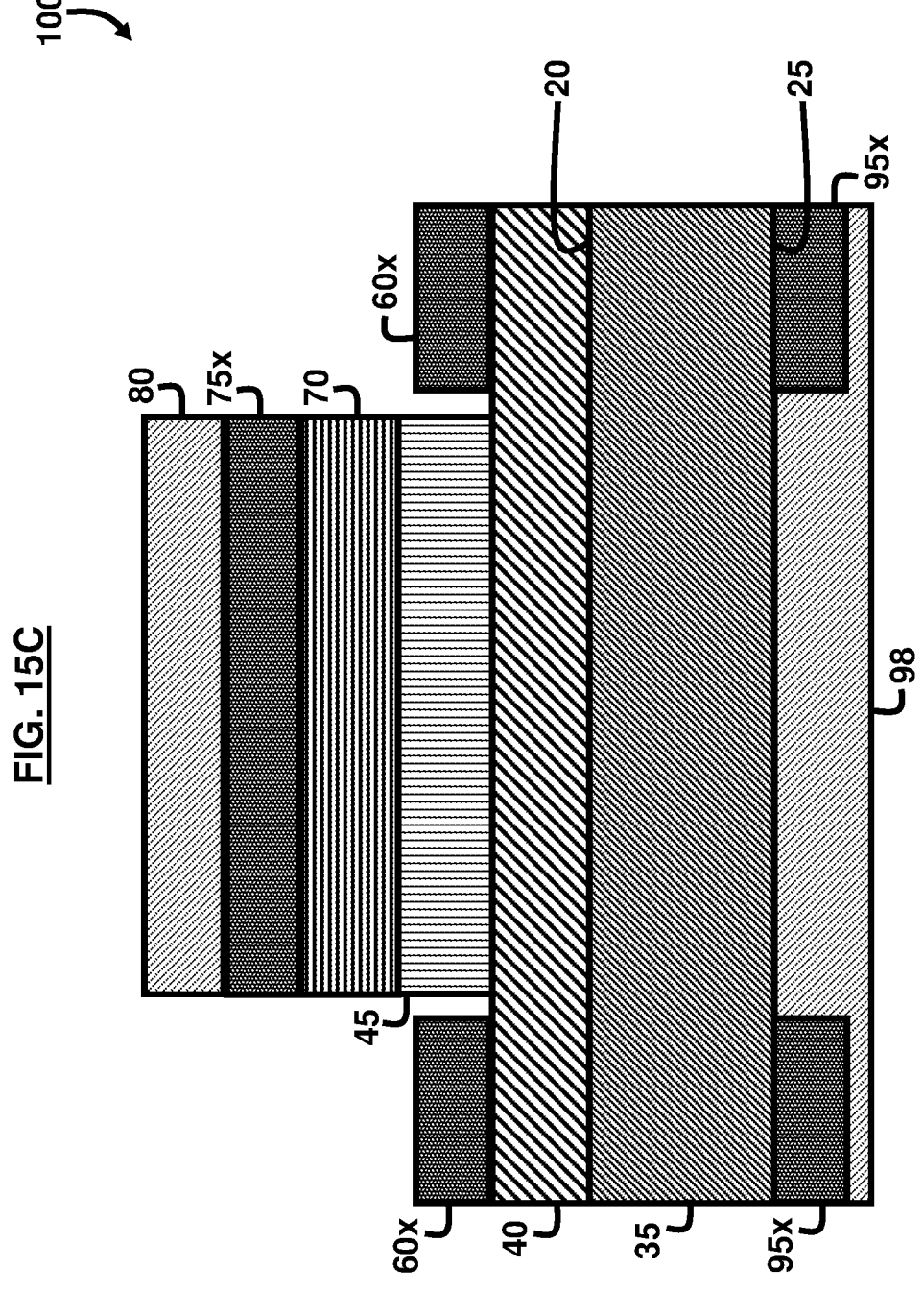
FIG. 15C is a schematic diagram illustrating the diamond-based particle detector of FIGS. 15A and 15B without a second side first doped layer or a second side intrinsic diamond layer, according to an embodiment herein.

Accordingly, FIG. 15B illustrates that the diamond-based particle detector 100 may further comprise the neutron conversion layer 98 contacting the second side intrinsic diamond layer 85 and the second metal contact 95*x* such that the second metal contact 95*x* also contacts the second side intrinsic diamond layer 85. Moreover, in an example, FIG. 15C with reference to FIGS. 1 through 15B, illustrates that the diamond-based particle detector 100 may further comprise the neutron conversion layer 98 contacting the diamond substrate 35 and the second metal contact 95*x* such that the second metal contact 95*x* also contacts the diamond substrate 35.

According to some examples, the various layers 40, 45, 55, 85 may be fabricated by CVD techniques, and the metal contacts 60*x*, 75*x*, 95*x* may be fabricated by e-beam deposition, sputtering, or any other suitable metal deposition technique. The first side intrinsic diamond layer 45 may have a thickness value according to one of the thickness ranges specified herein, for example. In some embodiments, the layers 40, 45, 55, 85 each comprise single crystal (e.g., (111), (100), or other orientation) diamond. Leads (not shown) may be provided to couple the metal contacts 60*x*, 75x, 95x with an external circuit (not shown). In some embodiments, the layers 40, 45, 55, 85 may each comprise polycrystalline material.

In some embodiments, the detector 100 may be devoid of a boron-containing layer, but the first side intrinsic diamond layer 45 thereof (either single crystal or polycrystalline diamond) may act as an active layer for incident protons and/or alpha particles. In some embodiments, the first side intrinsic diamond layer 45 may be optimized to match the absorption depth (about 5 μm) of approximately 2 MeV alpha particles. The thin first side intrinsic diamond layer 45 may be sensitive to alpha particles and protons but can exhibit reduced or minimal sensitivity to other charged particles and gamma radiation. Metal contacts 60x, 75x, 95x may be provided to collect charge generated in the first side intrinsic diamond layer 45. Charge created in the first side intrinsic diamond layer 45 is collected efficiently, as a result of induced electric field across thin intrinsic diamond layer p-i-n diamond-based semiconductor detector 100, in the form of a radiation signal.

One aspect of diamond diode detectors relates to the polarization effect in diamond semiconductors. The polarization effect causes a degradation of charge collection efficiency with time. To address this issue, in some embodiments a diamond diode may be periodically pulsed with a forward bias to neutralize (e.g., remove) the polarization buildup. Such forward bias pulse may be applied to a diamond diode device configured to operate with a non-forward bias (e.g., a reverse bias or zero bias). By periodically applying a forward bias to a diamond diode, charge that has been trapped in the diamond is quickly swept away, effectively restoring field strength and resetting the diamond. Pulse frequency may be chosen for the end use application. For cases in which polarization occurs rapidly due to a higher flux, the forward bias frequency can be increased. The pulse frequency should be much less than the time constant of the polarization.

In some embodiments, the diamond diode-based detector 100 may be configured to operate in pulse mode for initial detection rates over 100 kHz. Operations at much higher neutron flux (about $10^{12}$ n cm$^{-2}$ s$^{-1}$) can be achieved in pulse mode by using a very thin neutron conversion layer 80 (about 50 nm) and a suitably sized active detection area (e.g., 0.5 mm by 0.5 mm in one embodiment), and by optimizing the read-out electronics to handle detection rates over 100 MHz. Current mode operation is limited only by the radiation hardness of a diamond diode device, a property that makes diamond the best choice among semiconductor diode detectors.

Experimental detectors can be constructed to test the efficacy of the design and assess the results of the sensing measurements. A detector can be constructed in accordance with the configurations described above for the devices 10a, 10b and detector 100 having the PIN or PI on the "top side" of the detector structure and a second detector with p-type diamond. This represents two modes of detection, which can be integrated into the same device 10a or 10b or detector 100. These can be used to measure a beta source and an alpha source. The alpha particles will be stopped by the PIN or carrier diamond thickness, and only the beta particles will penetrate through to the backside of the detector, enabling the detection and differentiation of the two particle species. To demonstrate this, the second detector can have metallization strips facing away from the sources, and its response to alpha and beta sources measured. The detectors can be connected to count triggering readout electronics.

Figures 16A, 16B:
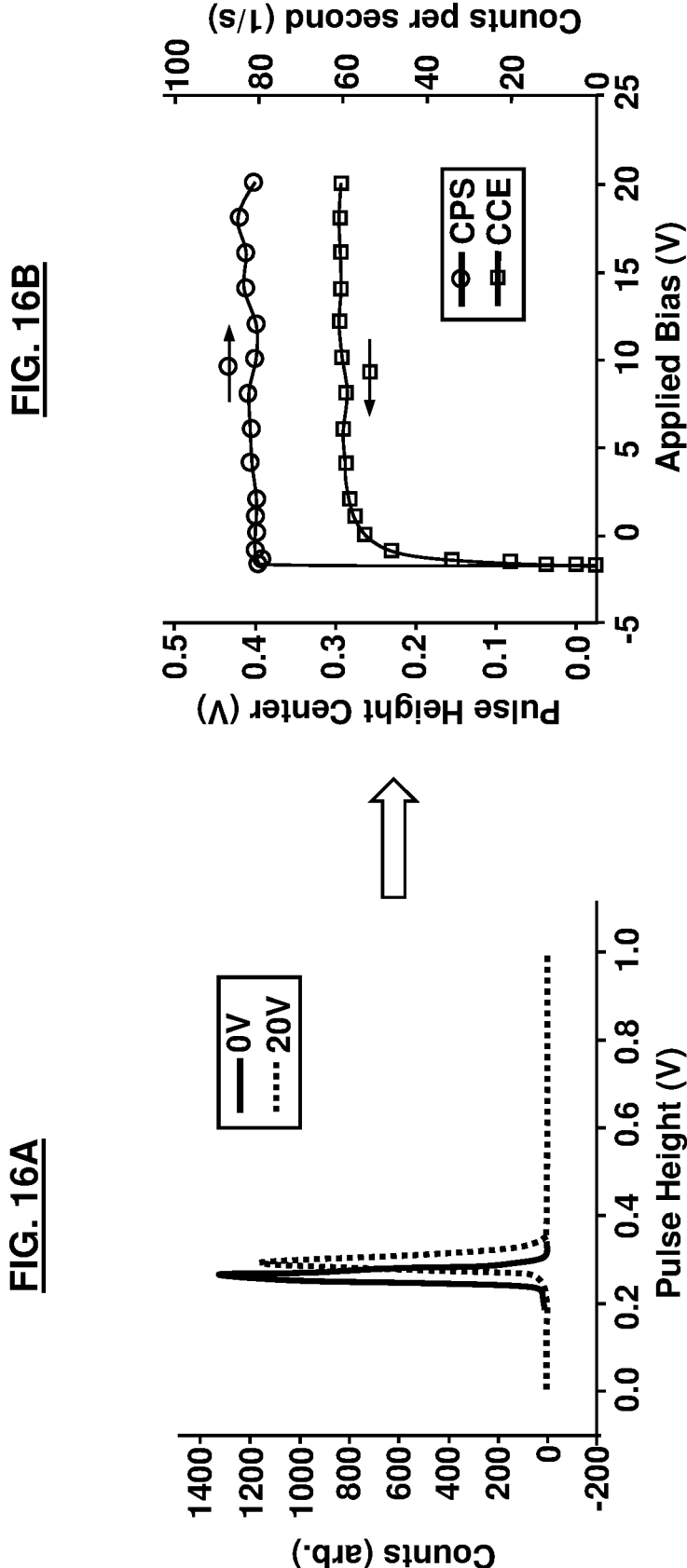
FIG. 16A is a graphical representation illustrating a digitized histogram of voltage pulse heights measurements after counting for 2 minutes with an applied bias of OV and for 20V, with an alpha source, according to an embodiment herein.
FIG. 16B is a graphical representation illustrating charge collection efficiency and counting rate measurements as a function of applied bias, with an alpha source, according to an embodiment herein.
Figure 16C:
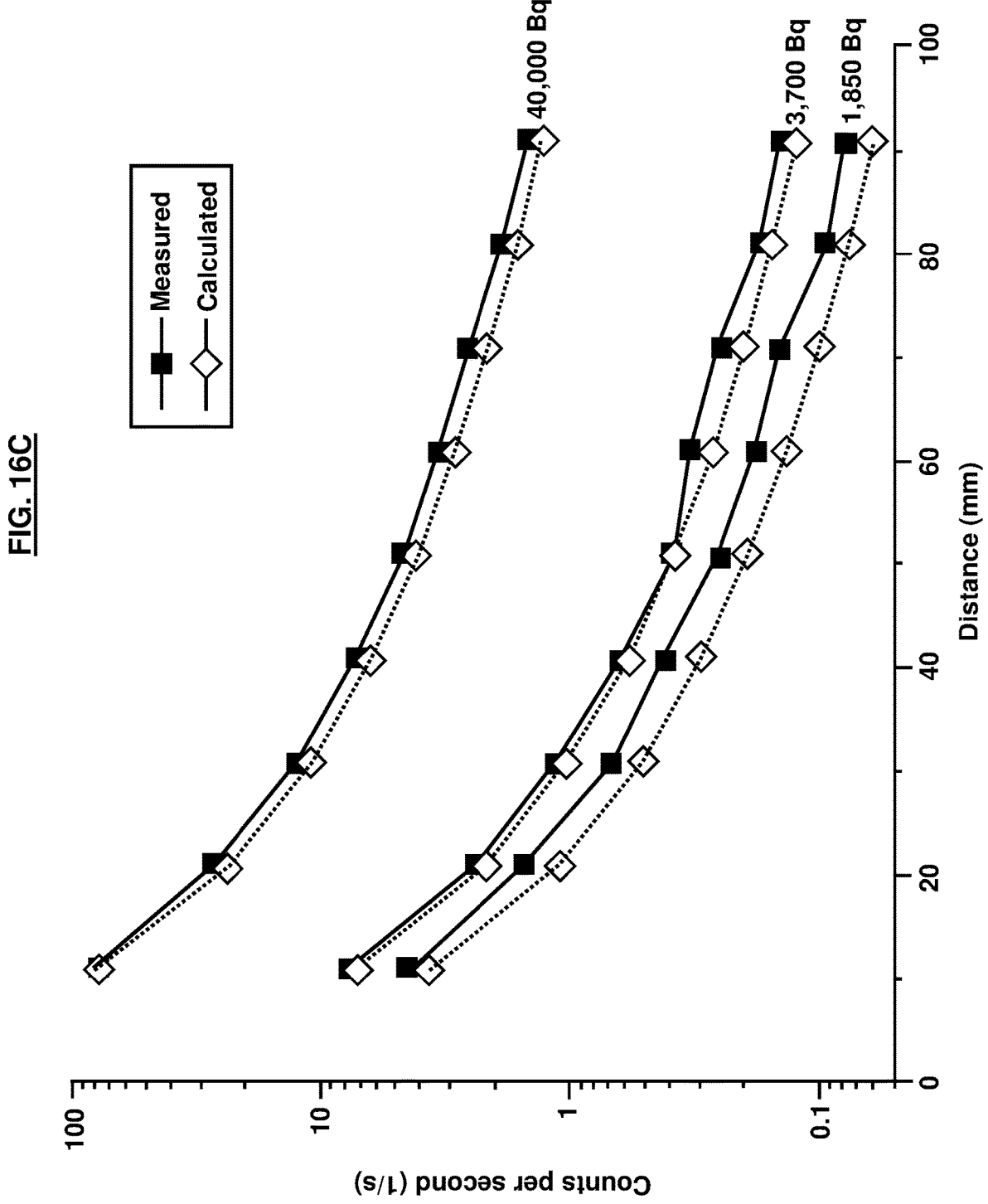
FIG. 16C is a graphical representation illustrating counting rate measurements as a function of distance for various activity sources, with an alpha source, according to an embodiment herein.
Figure 16D:
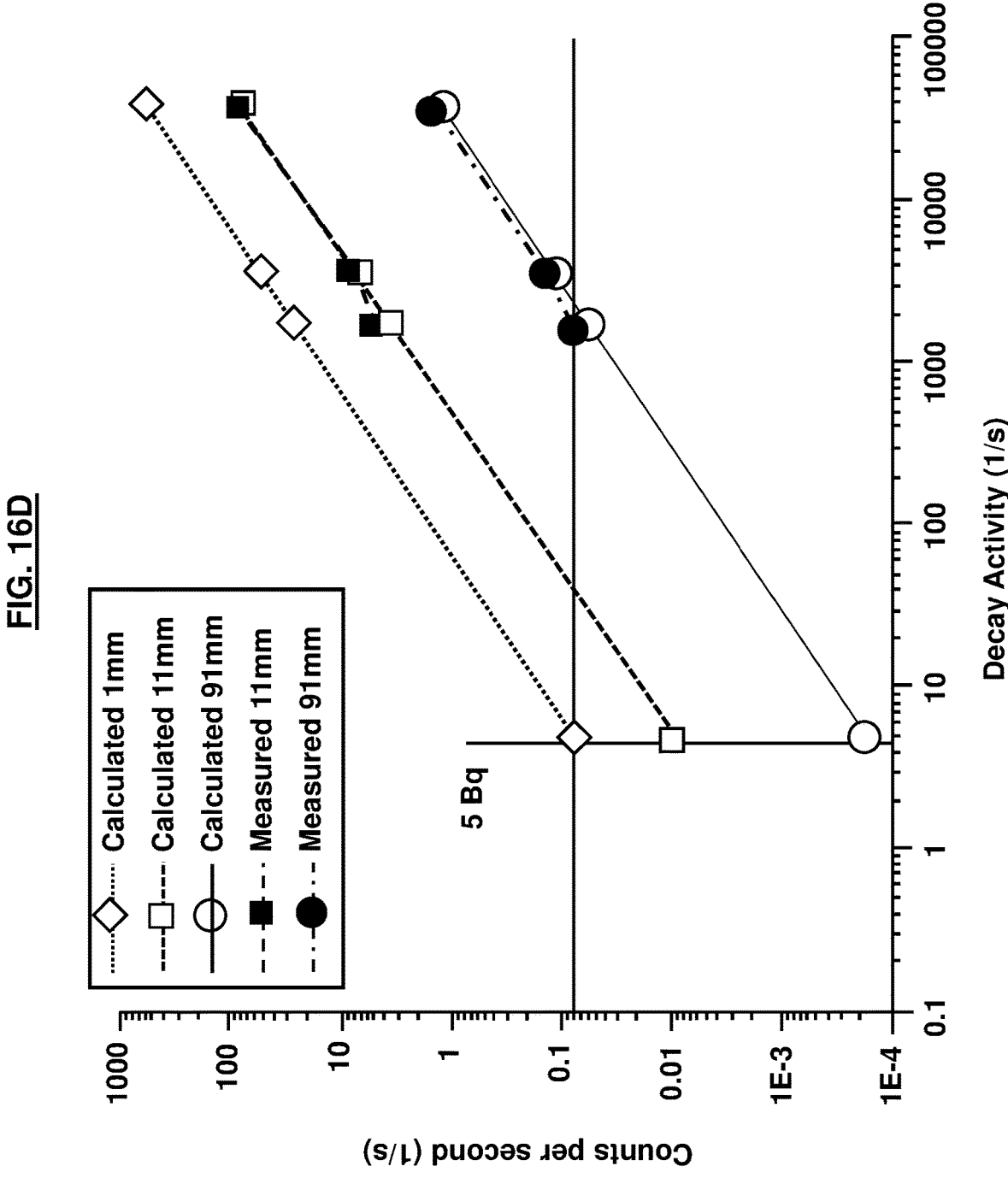
FIG. 16D is a graphical representation illustrating the measured and calculated detection events as a function of decay activity and distance from the alpha source, according to an embodiment herein.
Figure 16E:
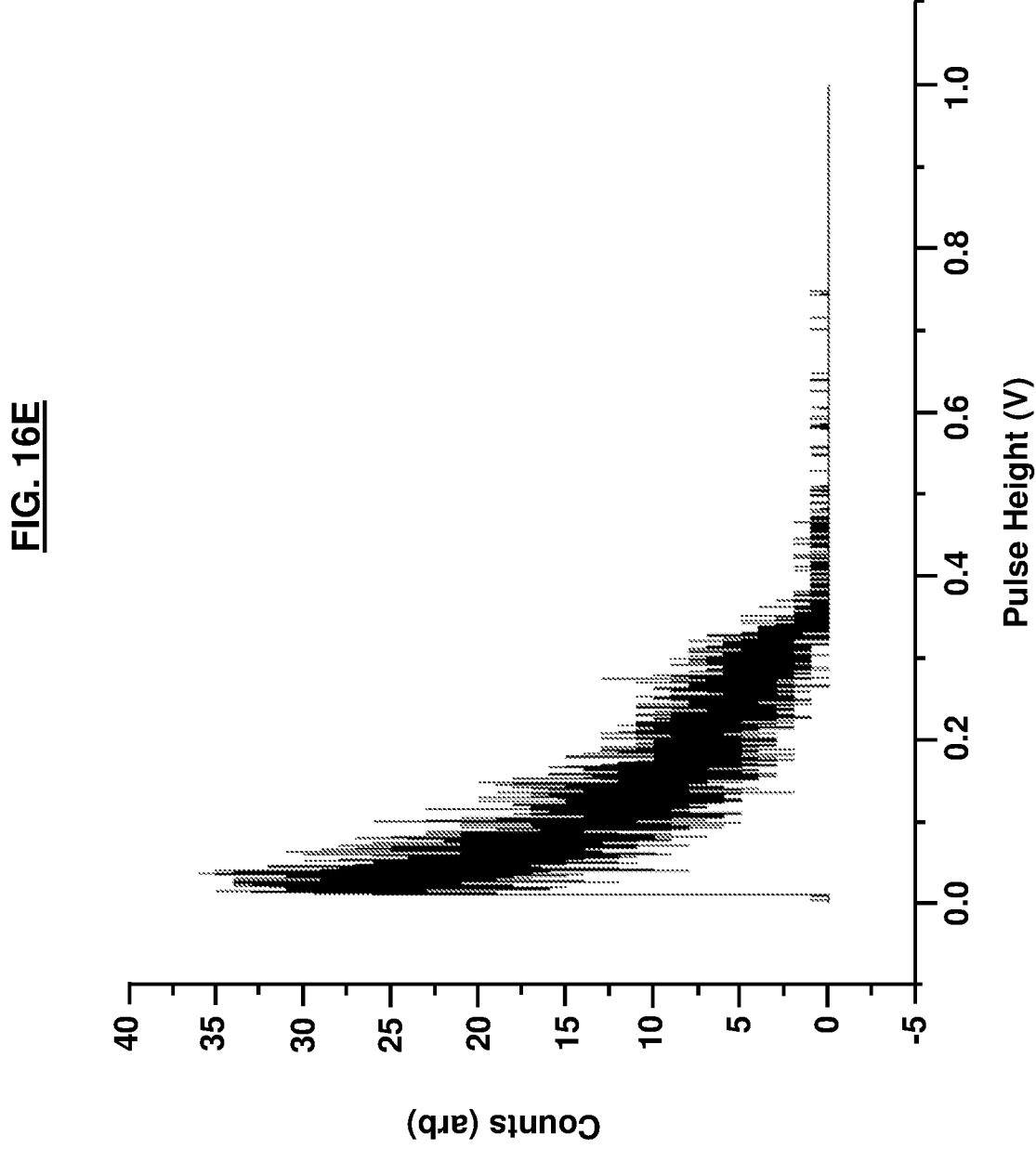
FIG. 16E is a graphical representation illustrating a digitized histogram of voltage pulse heights at an applied bias of 20V, with a beta source, according to an embodiment herein.

FIGS. 16A through 16E, with reference to FIGS. 1 through 15C, are graphs illustrating the experimental results for a front side P-I-N structure constructed in a manner consistent with the dual function diamond-based semiconductor devices 10a, 10b and two-in-one diamond diode-based particle detector 100 with radiation from an alpha source (Am 241) (FIGS. 16A through 16D) and a beta source (Sr 90) (FIG. 16E). FIG. 16A is a graph illustrating a digitized histogram of voltage pulse heights after counting for 2 minutes with an applied bias of OV and for 20V, respectively. FIG. 16B is a graph illustrating the charge collection efficiency and counting rate as a function of applied bias. FIG. 16C is a graph illustrating the counting rate as a function of distance for various activity sources, which demonstrates the devices 10a, 10b and detector 100 is sensitive to 0.1 alpha particles per second. The calculated values consider the activity of the source, and the geometric constraints of the measurement. FIG. 16D is a graph illustrating the measured and calculated detection events as a function of decay activity and distance from the source. The horizontal line is to show that the devices 10a, 10b and detector 100 would be sensitive to a 5Bq source 1 mm away from the devices 10a, 10b or detector 100. FIG. 16E is a graph illustrating the digitized histogram of voltage pulse heights at an applied bias of 20V, with a beta source (Sr90). This demonstrates the same detector is sensitive to both alpha particles and beta particles. Moreover, the zero volt measurement results are surprising compared to expected results. Additionally, the saturation of the charge collection at zero volt is also surprising.

Figure 17A:
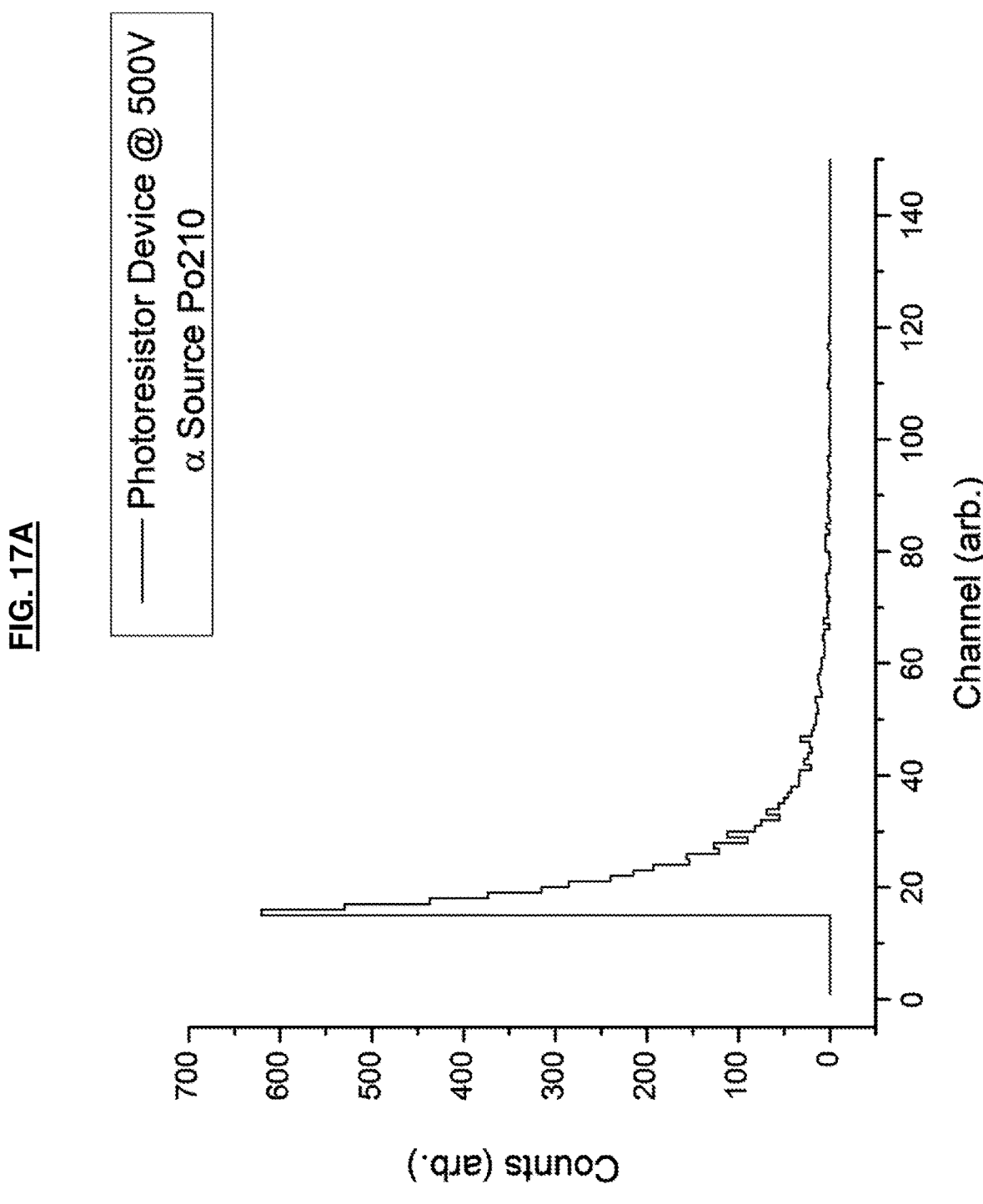
FIG. 17A is a graphical representation illustrating results of Po 210 alpha source detection using a photoresistor type detector, according to an embodiment herein.
Figure 17B:
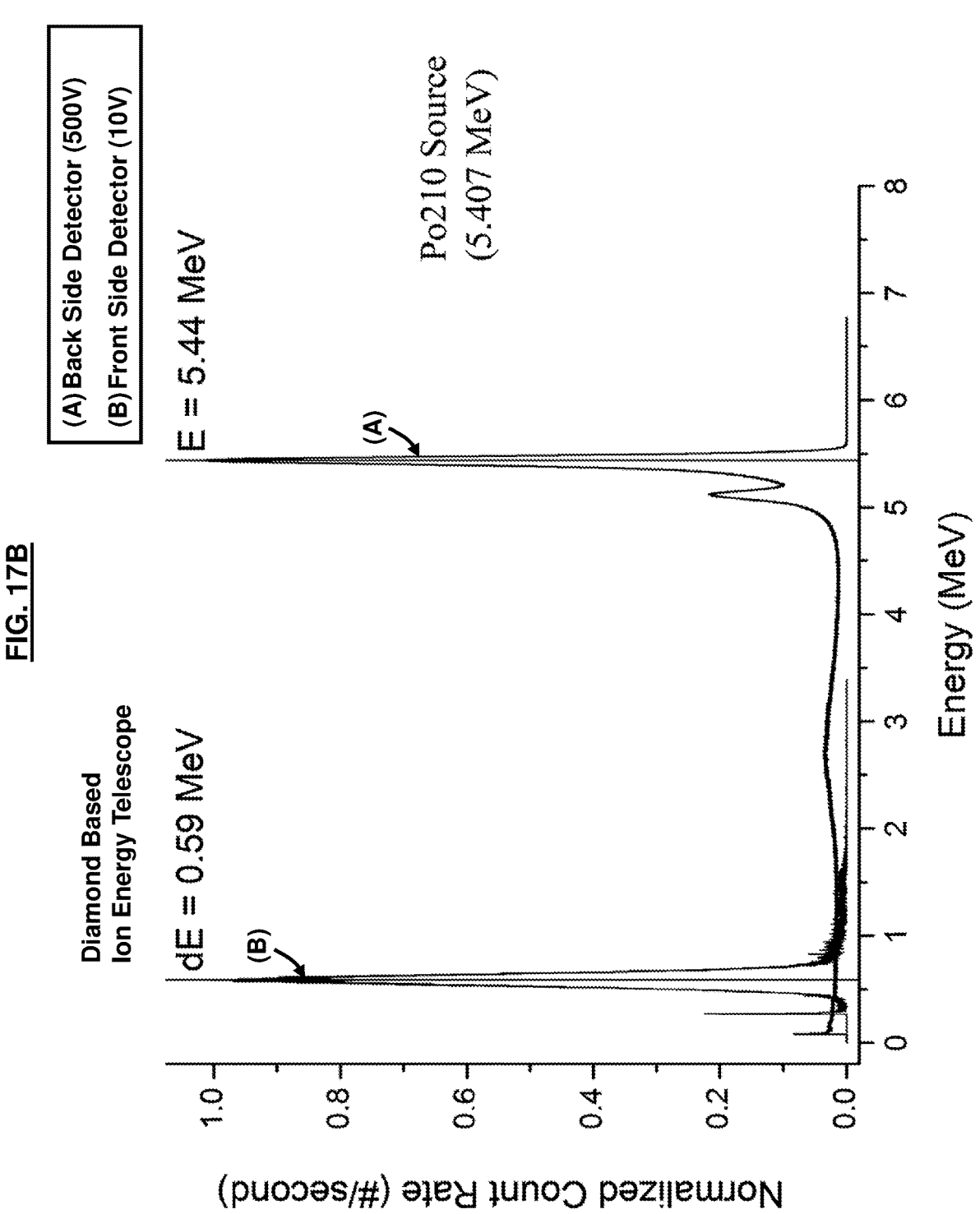
FIG. 17B is a graphical representation illustrating results achieved using a double sided detector, according to an embodiment herein.

FIGS. 17A and 17B, with reference to FIGS. 1 through 16E, are graphs illustrating the experimental results using a photoresistor configuration as provided by the embodiments herein. The data generated for FIG. 17A are for a Po 210 alpha source detection using a photoresistor configuration as provided by the embodiments herein. FIG. 17B illustrates data from a double-sided detector as provided by the embodiments herein. Specifically, FIG. 17A illustrates the response of a photoresistor type diamond detector to alpha radiation, with the application of 500V) with a Po210 alpha source. The vertical axis shows the number of counts measured vs. the voltage channel they were measured in shown on the horizontal axis, using an ORTEC-based pulse counting electronics system. The signal connection was fed into a transimpedance amplifier and then into a spectroscopy amplifier. The photoresistor detector was made by depositing a thin film of doped diamond and metal contacts on the surface, which in this example device were separated by 250 um. FIG. 17B illustrates the response of a two sided diamond detector comprising a thin diode-type top side detector and a thick back side detector. The data shows the response to alpha particles, with independent measurements of the particles from each side. The measurement is similar to that described for FIG. 17A. The graph in FIG. 17B shows the counts vs. voltage channel, and line A is the measurement of the particles from the thick back-side detector, and line B is the measurement from the front-side detector. The results show that the particle loses some but not all of its energy in the thin front side and loses the rest of its energy in the back side detector. This measurement could be used to identify the mass of the particle. The signal was collected via an ORTEC-based pulse counting electronics system as described for FIG. 17A. The results shown in FIGS. 17A and 17B are unique and surprising as the embodiments herein achieve 100% counting efficiency with a thin active layer (e.g., first side structure (diode 30)), and with a diamond energy telescope created for ion mass measurement having thin first side layers (e.g., first side first doped layer 40 and first side intrinsic diamond layer 45).

In the diamond based solid state particle/radiation devices 10a, 10b and detector 100 both the first side 20 and the second side 25 have independent mechanisms of particle detection to increase detector efficiency, and/or make independent measurements of, and distinguish multiple particle species, including but not limited to alpha, beta, gamma, X-ray, UV, proton, neutron, and energetic heavy ions. The embodiments herein achieve this by providing a diamond plate (polycrystalline and single crystal Type Ib, IIa, IIb) with two structures; namely first side 20 and second side 25. The first side 20 has a diode type structure and the second side 25 has a photoresistor type structure. There is an optional neutron conversion layer 80, 98 to accommodate the detection of neutrons. The side (either the first side 20 or the second side 25) nearest the source will detect particles/radiation with a shallow penetration depth. The opposite side (either the second side 25 or the first side 20) that is further from the source will detect particles/radiation with deep penetration depth. Either the first side 20 or the second side 25 can be nearest the source. The metal contacts 60, 60x, 75, 75x, 95, 95x are used to supply bias voltages, and readout signals generated by radiation sources. By using diamond, the devices 10a, 10b and detector 100 are insensitive to visible light and suppresses thermal noise, as well as diffuse thermal variations, radiation hardness. In this regard, the embodiments herein provide the functionality of a solid state ion chamber, with 100% charge collection efficiency, and the ability to be tuned to various particle/radiation species, rugged surface compatible with decontamination. Moreover, the embodiments herein provide for the ability to detect and distinguish multiple particle species with the same chip.

The dual function diamond-based semiconductor devices 10a, 10b and two-in-one diamond diode-based particle detector 100 are applicable across a wide variety of applications including, but not limited to scientific research, imaging, medical, space/low orbit and aeronautics, mining, personal radiation safety, industrial safety, airport security and safety, transportation hubs, borders, ports, radiation monitoring for national defense and homeland security, military, nuclear powered warships, and radiation hazard areas.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A dual function diamond-based semiconductor device comprising:
   a vertically stacked structure comprising a first side and a second side, wherein the first side is oppositely positioned to the second side;
   a diode arranged on the first side, wherein the diode comprises:
      a diamond substrate;

a first side first doped layer adjacent to the diamond substrate; and
      a first side intrinsic diamond layer adjacent to the first side first doped layer;
   a photoresistor arranged on the second side, wherein the photoresistor comprises:
      the diamond substrate shared with the diode; and
      a second side first doped layer adjacent to the diamond substrate.

2. The semiconductor device of claim 1, wherein the first side first doped layer is positioned between the diamond substrate and the first side intrinsic diamond layer.

3. The semiconductor device of claim 1, wherein the first side first doped layer comprises a p or n type diamond material.

4. The semiconductor device of claim 1, wherein the diode further comprises a metal contact adjacent to the first side first doped layer.

5. The semiconductor device of claim 1, wherein the diode further comprises a metal contact adjacent to the first side intrinsic diamond layer.

6. The semiconductor device of claim 1, wherein the diode further comprises a first side second doped layer adjacent to the first side intrinsic diamond layer.

7. The semiconductor device of claim 6, wherein the first side intrinsic diamond layer is positioned between the first side first doped layer and the first side second doped layer.

8. The semiconductor device of claim 6, wherein the diode further comprises a metal contact adjacent to the first side second doped layer.

9. The semiconductor device of claim 8, wherein the diode further comprises a neutron conversion layer adjacent to the metal contact.

10. The semiconductor device of claim 9, wherein the metal contact is positioned between the neutron conversion layer and the first side second doped layer or the first side intrinsic diamond layer.

11. The semiconductor device of claim 6, wherein each of the first side first doped layer, the second side first doped layer, the first side intrinsic diamond layer, and the first side second doped layer comprises a single crystal material, polycrystalline material, or a nanocrystalline material.

12. The semiconductor device of claim 1, wherein the second side first doped layer comprises a p-type diamond material, a n-type diamond layer, a second side intrinsic diamond layer, and/or an additional low resistance layer comprising a p or n diamond or conducting nanocarbon layer adjacent to the diamond substrate.

13. The semiconductor device of claim 1, wherein the photoresistor further comprises a metal contact adjacent to the second side first doped layer, a second side intrinsic diamond layer, or to the diamond substrate.

14. The semiconductor device of claim 13, wherein the photoresistor further comprises a neutron conversion layer adjacent to the metal contact and (i) the second side first doped layer, (ii) the second side intrinsic diamond layer, or (iii) the diamond substrate.

15. The semiconductor device of claim 14, wherein (i) the second side first doped layer or (ii) the second side intrinsic diamond layer is positioned between the diamond substrate and the neutron conversion layer.

16. The semiconductor device of claim 14, wherein the metal contact is positioned between the neutron conversion layer and (i) the second side first doped layer, (ii) the second side intrinsic diamond layer, or (iii) the diamond substrate.

17. A dual function diamond-based semiconductor device comprising:

19 a vertically stacked structure comprising a first side and a second side, wherein the first side is oppositely positioned to the second side;

a diode arranged on the first side, wherein the diode comprises:

a diamond substrate;

a first side first doped layer adjacent to the diamond substrate; and a first side intrinsic diamond layer adjacent to the first side first doped layer;

a photoresistor arranged on the second side, wherein the photoresistor comprises:

the diamond substrate shared with the diode.

18. A diamond-based particle detector comprising:

a diamond substrate comprising a first side and a second side;

a first side first doped layer contacting the first side of the diamond substrate;

a first metal contact contacting the first side first doped layer;

a first side intrinsic diamond layer contacting the first side first doped layer, wherein the first side first doped layer is positioned between the diamond substrate and the first side intrinsic diamond layer;

(i) a second side first doped layer or (ii) a second side intrinsic diamond layer contacting the second side of the diamond substrate; and a second metal contact contacting (i) the second side first doped layer or (ii) the second side intrinsic diamond layer.

19. The diamond-based particle detector of claim 18, further comprising:

a first side second doped layer contacting the first side intrinsic diamond layer;

a third metal contact contacting the first side second doped layer; and a neutron conversion layer contacting the third metal contact.

20. The diamond-based particle detector of claim 18, further comprising a neutron conversion layer contacting the second metal contact and (i) the second side first doped layer or (ii) the second side intrinsic diamond layer.

* * * * *